United States Patent [19]

Sato et al.

[11] Patent Number: 4,774,480
[45] Date of Patent: Sep. 27, 1988

[54] PHASE-LOCKED LOOP HAVING SEPARATE SMOOTHING AND LOOP FILTERS

[75] Inventors: Hideo Sato, Hitachi; Kazuo Kato, Ibaraki; Takashi Sase; Kenichi Onda, both of Hitachi; Ichiro Ikushima, Chigasaki, all of Japan

[73] Assignee: Hitachi, Ltd., Tokyo, Japan

[21] Appl. No.: 19,113

[22] Filed: Feb. 26, 1987

[30] Foreign Application Priority Data

| Feb. 27, 1986 | [JP] | Japan | 61-40413 |
| Apr. 30, 1986 | [JP] | Japan | 61-97958 |
| May 9, 1986 | [JP] | Japan | 61-104617 |
| Oct. 1, 1986 | [JP] | Japan | 61-231204 |

[51] Int. Cl.$^4$ ................................ H03L 7/08
[52] U.S. Cl. .................................. 331/1 A; 331/8; 331/14; 331/17; 331/27; 331/DIG. 2
[58] Field of Search ........... 331/14, 17, 25, 27, DIG. 2, 331/1 A, 8

[56] References Cited

U.S. PATENT DOCUMENTS

| 4,290,028 | 9/1981 | Le Grand | 331/17 X |
| 4,465,982 | 8/1984 | Jernakoff | 331/17 X |
| 4,635,000 | 1/1987 | Swanberg | 331/17 X |

FOREIGN PATENT DOCUMENTS 59-12049 3/1984 Japan .
59-202736 11/1984 Japan .

OTHER PUBLICATIONS

Keller et al, "Transmission Design Criteria for a Synchronous Token Ring", IEEE Journal on Selected Areas in Communications, vol. SAC-1, No. 5, Nov. 1983, pp. 721-733.

Primary Examiner—Siegfried H. Grimm
Attorney, Agent, or Firm—Antonelli, Terry & Wands

[57] ABSTRACT

A PLL comprising a phase comparator circuit for detecting the phase of a pulse signal based upon the input signal and the phase of a pulse signal based upon the output signal, a smoothing filter for smoothing the output of the phase comparator circuit, a loop filter for controlling the oscillation frequency on the basis of the smoothing filter, and a voltage controlled oscillator circuit for sending out the output signal having a frequency corresponding to the voltage based upon the output of the loop filter. Since the smoothing filter is separated from the loop filter, time constants of the smoothing filter and the loop filter can be set independently and with precision. If the time constant of the smoothing filter is chosen to be extremely small, for example, the time constant of the phase-locked loop is defined by the time constant of the loop filter. It is thus possible to define the time constant of the phase-locked loop by only selecting the time constant of the loop filter. Further it is possible to both suppress the jitter of the phase-locked loop and reduce the frequency ripple, for example.

16 Claims, 21 Drawing Sheets

| 401 | 501 | 601 |
|---|---|---|
| 0 | 0 | 0 ( FAST ACQUISITION STATE ) |
| 0 | 1 | 0 ( FAST ACQUISITION STATE ) |
| 1 | 0 | HOLD THE PREVIOUS STATE |
| 1 | 1 | 1 (HIGH JITTER SUPPRESSION STATE ) |

PHASE-LOCKED LOOP HAVING SEPARATE SMOOTHING AND LOOP FILTERS

BACKGROUND OF THE INVENTION

The present invention relates to a phase-locked loop.

In a phase-locked loop (hereafter sometimes abbreviated as PLL), the phase of an input pulse signal is compared with that of the output pulse of a voltage controlled oscillator circuit (hereafter sometimes referred to as VCO) by a phase comparator circuit. The output current of the phase comparator circuit representing the detected phase difference is supplied to a loop filter. The voltage generated by the loop filter is supplied to the above described voltage controlled oscillator to effect feedback control. The output pulse is thus synchronized to the input pulse. The loop filter functions to define the response characteristics and eliminate noises.

Since the oscillator circuit constituting the PLL is synchronized in phase to the input signal of the PLL, the transmitted frequency/phase modulated signal can be reproduced at the receiving side. Accordingly, it is possible to know at the receiving side what kind of frequency/phase modulation has been effected at the transmission side. As a result, the PLL can be used as a frequency/phase demodulator.

Further, the PLL can be used for tracking signals having the Doppler effect because it has a tracking property owing to the feedback. In addition, the PLL has narrow-band selectivity which sharply suppresses signals and noises other than the synchronized input signal. In recent years, therefore, the PLL is used also for timing signal extraction in PCM communication equipment employed in optical communication, for example. The PLL is widely used in fields other than the above described field.

It is desirable that the output signal of the PLL does not contain a frequency ripple. This frequency ripple is incurred when a ripple component is included in the output signal level of the phase comparator.

In the PLL of the prior art, the frequency ripple is reduced by a smoothing filter which is formed by adding a parallel capacitor to a resistor constituting the loop filter.

An example of such a phase synchronization circuit is disclosed in a literature entitled "Transmission Design Criteria for Synchronous Token Ring" by Keller, IEEE Journal on Selected in Communications, SAC-1 (1983).

The above described method is simple because the frequency ripple can be reduced by only adding a capacitor to the loop filter. If it is attempted to enhance the effect of reducing the frequency ripple, however, peaking is caused in the loop characteristic and the jitter component of the input signal is amplified. Therefore, it is difficult to reduce the frequency ripple while restraining the jitter.

That is to say, it is desirable to choose the time constant of the loop filter on the basis of the condition demanded for individual application of the phase-locked loop such as an especially short frequency acquisition time or small frequency ripples. However, this selected value is not a value desired from the viewpoint of jitter prevention or response improvement. As a result, satisfactory characteristics cannot be obtained.

It is possible to remove the ripple contained in the output of the phase comparator circuit by increasing the time constant of a capacitor and a resistor constituting the loop filter without using the above described parallel capacitor. However, this increased time constant degrades the response performance.

Further, the oscillator circuit of the PLL disclosed in the above described literature is configured to generate a pulse signal having a duty ratio of 50%. By utilizing the fact that the duty ratio of the oscillation signal is 50%, the phase comparator circuit detects the phase difference between the input signal and the oscillation signal (i.e., the output signal) and generates pulses having phase difference information thus detected. Accordingly, the precision in detection of phase difference is influenced by the duty ratio. In the phase comparator circuit of the above described literature, mutual interference is caused between detected two phase difference signals ($T_D$, $T_U$) representing the phase difference. In the above described literature, however, the mutual interference is not considered. Therefore, the detected phase difference is affected by this mutual interference between signals. Because of the above described problems, it is difficult to raise the operation speed of the phase comparator circuit of the prior art. Therefore, when the phase comparator circuit of the prior art is used in fields demanding high speed operation, such as optical communication, it is not necessarily sufficient.

In optical communication, a plurality of optical transmission modules respectively including PLL's are employed to produce timing signals on the basis of digital PCM-coded optical signals. The signal which has been transmitted through the optical cable arrives at the receiving side with high speed and jitter.

Upon input of the signal, the phase-locked loop used for such application must respond to the input signal at an increased speed to quickly acquire or pull in the input signal. After the input signal acquisition, the bandwidth of the PLL (or the bandwidth of the noise) must be kept small to suppress the input jitter. In general, however, the acquisition characteristics of the PLL contradict its jitter suppression characteristics. That is to say, reducing the time constant of the loop filter for fast acquisition expands the PLL bandwidth and deteriorates the jitter suppression characteristics.

A PLL circuit of the prior art capable of coping with this problem is described in the Japanese Post-Exam publication JP-B-59-12049 by Nagano et al (laid-open on Nov. 7, 1977 as Laid-Open No. 52-132760). In this PLL circuit, two time constant circuits are provided and changed over so as to shorten the time constant of the filter when the frequency difference between the input signal and the output signal of the voltage controlled oscillator has exceeded a predetermined value. In a PLL circuit described in the Japanese Laid-Open application No. JP-A-59-202736 by Chiba et al, laid open on Nov. 16, 1984, a detector for detecting whether the PLL is synchronized or not is disposed at the output side of the phase comparator, and the time constant of the loop filter is made small in the asynchronous state.

In the aforementioned PLL described in the above-mentioned JP-B-59-12049, the time constant of the loop filter is not changed over until the frequency of the input signal largely differs from the free running frequency (i.e., the oscillation frequency obtained when the input control voltage is zero) of the VCO. In the PLL described in the above-mentioned JP-A-59-202736, the time constant of the loop filter is changed over when the oscillation frequency of the VCO is not in synchronism with the input signal. Either of these PLL's shortens the acquisition time or pull-in time in the pull-out state. The acquisition or pull-in process of the PLL includes a process starting from the time when the PLL has been synchronized to the input signal and ending when the phase difference between the input signal and the VCO output signal reduces below a predetermined value. The time necessary for this process is also desired to be short. However, the above described two prior arts have problems as described below. In the acquisition process of the former mentioned prior art after the frequency difference between the input and the output of the VCO has decreased below a predetermined value, the acquisition time cannot be made sufficiently small because the narrow loop bandwidth suitable to jitter suppression is selected. In the acquisition process of the latter mentioned prior art after the PLL has been synchronized to the input signal, the acquisition time cannot be made sufficiently small because the narrow bandwidth suitable to jitter suppression is also selected.

SUMMARY OF THE INVENTION

An object of the present invention is to provide a phase-locked loop which allows all of reduction of the frequency ripple contained in the output signal, fine response property and fine jitter suppression.

Another object of the present invention is to provide a phase-locked loop having a largely shortened acquisition time and fine jitter suppression characteristics.

Another object of the present invention is to provide a stable and fast phase comparator circuit which is affected by neither the duty ratio of the output signal of the oscillator nor the mutual interference between detected two phase difference signals representing the phase difference.

In accordance with one aspect of the present invention, the above described object is attained by separating the smoothing filter of the phase-locked loop from the loop filter to provide the loop filter with a rippleless current.

By separating the smoothing filter from the loop filter, the time constants of the smoothing filter and the loop filter can be established independently of each other. If the time constant of the smoothing filter is selected to be extremely small, for example, the time constant of the phase-locked loop is defined by the time constant of the loop filter. It thus becomes possible to establish the time constant of the phase-locked loop only by selecting the time constant of the loop filter. This not only facilitates the time constant establishment but also improves the selection precision.

From the above described points, it is possible to suppress the jitter of the phase-locked loop and reduce the frequency ripple without sacrificing the response property, for example.

In accordance with another aspect of the present invention, the PLL comprises a frequency acquisition or pull-in detection circuit for detecting whether the frequency acquisition has been completed, a phase difference detector for detecting whether the phase difference is less than a predetermined value, and a mode control circuit for outputting a time constant changeover signal of the loop filter when the PLL is in synchronism with the input signal and it is detected that the phase difference is less than a predetermined value.

In the above described configuration, the mode control circuit makes the time constant of the loop filter a small value to attain the fast acquisition state until the phase synchronization process for reducing the phase difference below a predetermined value nearly finishes after the completion of the frequency acquisition process for bringing the PLL into synchronization. Accordingly, the phase difference at the instant when the state is switched to the jitter suppression state is sufficiently small. Hence the time necessary for acquisition can be made very short. In addition, it is possible to suppress the high jitter after the acquisition in the same way as the prior art by making the time constant of the loop filter large.

In accordance with still another aspect of the present invention, a phase comparator circuit for comparing the phase of the first signal with that of the second signal and outputting a pulse signal representing the phase difference detects the level change point $t_1$ of the first signal and the first to third level change points $t_2$ to $t_4$ of the second signal by using the first to fourth means mainly composed of flip-flop circuits and detects the time difference between $t_1$ and $t_2$ as well as the time difference between $t_3$ and $t_4$ by using the fifth and sixth means composed of logic circuits.

With this configuration, the above described first to fourth means operate so as to change their output states at each of level change points $t_1$ to $t_4$. Thereby, the above described fifth and sixth means operate so as to output a pulse signal having a pulse width starting from the above described level change point $t_1$ and ending at $t_2$ as well as a pulse signal having a pulse width starting from the above described level change point $t_3$ and ending at $t_4$. Since the output pulses produced by the fifth and sixth means are sent out when the second signal is either "0" or "1", the detected phase signal is not changed by the duty ratio of the above described second signal and by the mutual interference of the output pulses.

DESCRIPTION OF THE PREFERRED EMBODIMENTS

Embodiments according to the present invention will hereafter be described by referring to drawings.

At first, an embodiment of a smoothing filter according to the present invention will be described by referring to FIG. 1. Control inputs of switches S1 to S3 are connected to pulse input terminals T1 to T3, respectively. The switch S1 is connected between reference voltage $-V_{ref}$ and a resistor R11, and the switch S2 is connected between the output of an operational amplifier A2 and a resistor R21. The switch S3 is connected to a grounded capacitor C2 and a noninverting input terminal of the operational amplifier A2 at one end and is connected to the output of an operational amplifier A1 at the other end. The operational amplifier A2 with the inverting input terminal connected to the output terminal constitutes a buffer amplifier. The interconnection of the above described switch S3, capacitor C2 and operational amplifier A2 constitute a sample and hold circuit.

The noninverting input terminal of the operational amplifier A1 is grounded, and a capacitor C1 is connected between the output terminal of the operational amplifier A1 and the inverting input terminal thereof. In addition, the other ends of the resistors R11 and R21 are connected to the inverting input terminal of A1. The interconnection of the above described operational amplifier A1, capacitor C1, resistor R11 and resistor R21 constitute an integrator for integrating the current flowing through R11 and R21. Resistors R11 and R21 define the current value to be integrated by the integrator.

An operational amplifier A3 is grounded at its noninverting input terminal and has a resistor R30 connected between its output terminal and its inverting input terminal. Further, a resistor R12 connected to the reference voltage $-V_{ref}$ at one terminal and a resistor R22 connected to the output of the operational amplifier A2 at one terminal are connected to the inverting input terminal of A3.

The operation of the embodiment according to the present invention interconnected as described above will now be described by referring to a time chart shown in FIG. 2.

Figure 2:
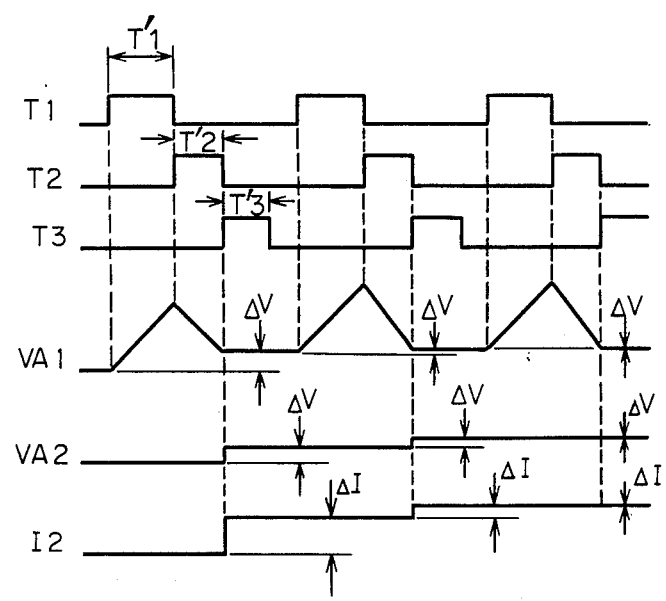
FIG. 2 shows the operation of the embodiment of FIG. 1.

The time chart of FIG. 2 is shown from the instant when the pulse widths of the input pulses T1 and T2 changes from a state satisfying the condition T'1=T'2 to another state satisfying the condition T'1>T'2, where T'1 and T'2 represent the pulse widths of T1 and T2, respectively. And the sampling pulse T3 is shown under the condition that it overlaps neither the pulse T1 nor the pulse T2.

Upon the closure of the switch S1 by the input pulse T1, the output voltage VA1 of the operational amplifier A1 constituting the integrator increases by integrating the current I1 flowing through R11. Upon the closure of the switch S2 by the input pulse T2, the output voltage VA1 decreases by integrating the current I2 flowing through R21.

Therefore, the output voltage VA1 of the integrator has increased by ΔV as a result of application of input pulses T1 and T2, and ΔV is represented as $$\Delta V = \frac{I1 \cdot T'1 - I2 \cdot T'2}{C1} \quad (1)$$

This integrated result is sampled in the sample and hold circuit composed of the switch S3, the capacitor C2 and the operational amplifier A2 at the timing of the sample pulse T3. At this timing, therefore, the current I2 increases by ΔI, and ΔI is represented as $$\Delta I = \frac{\Delta V}{R21} \quad (2)$$

It is recognized from equation (1) that ΔV decreases when I2 increases. As a result of repetition of the above described integration operation, therefore, ΔV as represented by the expression (1) approaches zero.

Figure 1:
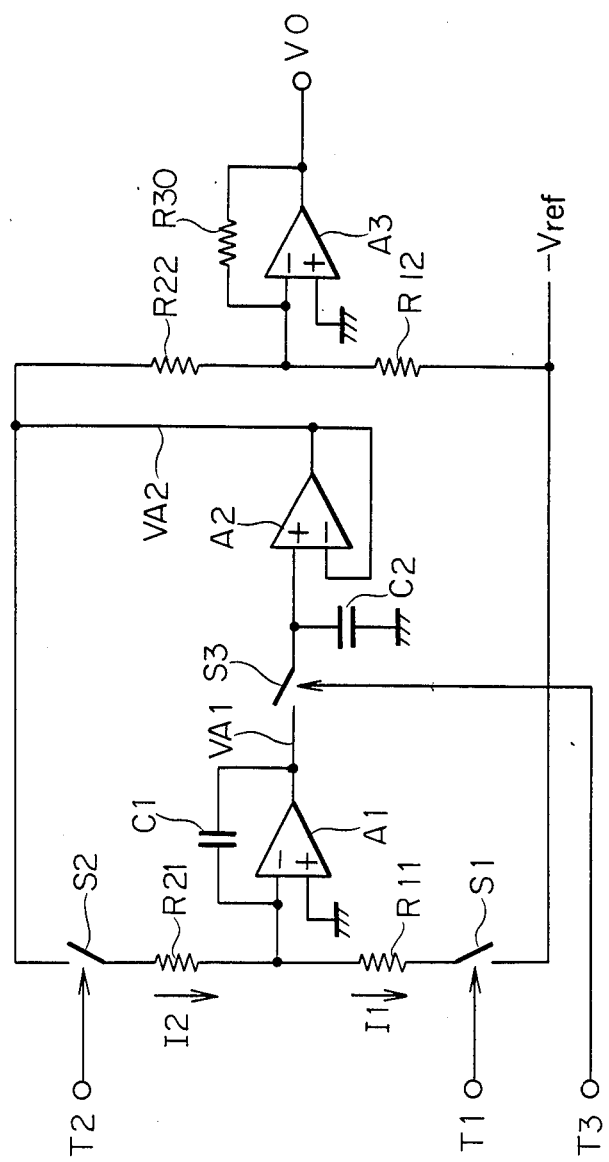
FIG. 1 shows an embodiment of a smoothing filter according to the present invention.

That is to say, the balance condition of the embodiment shown in FIG. 1 is represented as $$I1 \cdot T'1 = I2 \cdot T'2 \quad (3)$$

The operational amplifier A3 constitutes an adder in conjunction with resistors R12, R22 and R30. Assuming that R11=R12=R21=R22=R, the output voltage $V_0$ under the balanced condition can be represented as $$V_0 = (I2 - I1) \cdot R30$$

Since the expression (3) can be rewritten as I2=(T'1/T'2)·I1, $V_0$ is represented as $$V_0 = \frac{T'1 - T'2}{T'2} \cdot I1 \cdot R30 \quad (4)$$
$$= \frac{T'1 - T'2}{T'2} \cdot \frac{R30}{R} \cdot V_{ref}$$

From the expression (4), it is understood that the voltage which is in proportion to the difference between the pulse widths T'1 and T'2 of the input pulses T1 and T2 is obtained as the output $V_0$.

Since the result of integration in the operational amplifier A1 is sampled and held, the output voltage VA2 of the operational amplifier A2 has no ripples as shown in FIG. 2.

The step response characteristics will now be described. The closed loop of FIG. 1 is a sampled-data control system composed of proportional elements as indicated by expressions (1) and (2). Assuming that the number of sampling times is n, the step response is represented as $$V_0(n) = \{1 - (1 - G_l)^n\} \cdot V_0 \quad (5)$$

where $G_l$ is the loop gain. From the expressions (1) and (2), the loop gain $G_l$ can be written as $$G_l = \frac{\delta \Delta I}{\delta I2} = \frac{T'2}{C1 \cdot R_{21}} \quad (6)$$

From the expression (5), the stability condition is represented as $$0 < G_l < 2 \qquad (7)$$

When $G_l=1$, the response is effected with one sample. Since $G_l$ can be adjusted by means of C1 and R21 as represented by the expression (6), fast response becomes possible.

Since the result of integration is sampled and held as described above in the embodiment of the smoothing filter according to the present invention, the output voltage has no ripple. Since the time difference between the pulses T1 and T2 can be detected in a system which does not include a delay element but includes only a proportional element by detecting the time difference between T1 and T2 at the integrator input, it is possible to provide the smoothing filter with the high speed property by choosing the value of the loop gain such as unity. Further, this embodiment of the smoothing filter can be advantageously raised in precision without being directly affected by the characteristics of the sample and hold circuit etc., because the closed loop is constituted so that the current time product may be equal in the loop balance condition.

Figure 3:
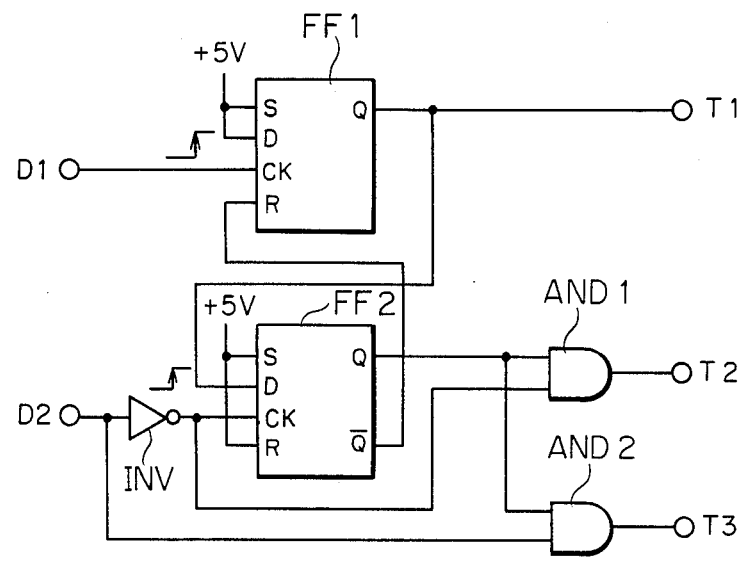
FIG. 3 shows an example of a circuit for controlling the smoothing filter of FIG. 1.

FIG. 3 shows an example of a circuit for controlling the embodiment of the smoothing filter according to the present invention. This circuit is used in the phase comparator circuit of the PLL to detect the time difference of rise timing between the input data D1 and D2 as the difference in pulse width between the output pulses T1 and T2. Output terminals T1 to T3 of this circuit are connected to the input terminals T1 to T3 of the circuit shown in the embodiment of the present invention.

This circuit is composed of flip-flops FF1 and FF2 activated at the rising edge of the clock, AND gates AND1 and AND2, and an inverter INV. The set terminal S and the data terminal D of the FF1 are connected to +5V, and the clock input terminal CK of the FF1 is connected to an input data terminal D1. Further, the reset terminal R of the FF1 is connected to the inverting output terminal $\overline{Q}$ of the FF2, and the output terminal Q of the FF1 is connected to an output pulse terminal T1 and the data input terminal D of the FF2.

On the other hand, the set terminal S and the reset terminal R of the FF2 are connected to +5V, and the clock input terminal CK of the FF2 is connected to a data input terminal D2 via an inverter INV. Two input terminals of AND1 are connected to the output terminal Q of the FF2 and the clock input terminal CK of the FF2, respectively. The output of the AND1 is connected to the pulse output terminal T2. And two input terminals of the AND2 are connected to the output terminal Q of the FF2 and the data input terminal D2, respectively. The output terminal of the AND2 is connected to the pulse output terminal T3.

The operation of the circuit of FIG. 3 connected as described above will now be described by referring to a time chart of FIG. 4.

Figure 4:
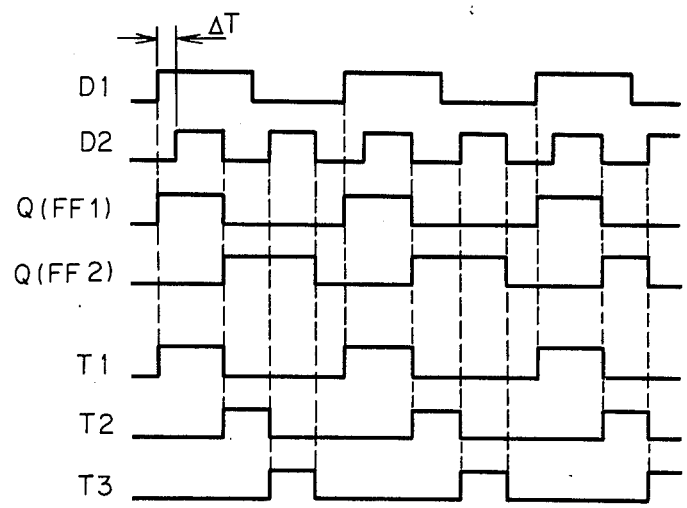
FIG. 4 shows the operation of the circuit illustrated in FIG. 3.

In FIG. 4, the input data D2 are consecutive clock signals, and the fundamental frequency of the input data D1 is approximately half that of D2. The duty ratio of the input data is 50%.

At the rising edge of the input data D1, the D input data of the FF1 is set in the FF1 to raise the output of the FF1 to "1". At the falling edge of the input data D2, the Q output of the FF1 is set in the FF2 to raise the Q output of the FF2 to "1". When the Q output of the FF2 is set to "1", the $\overline{Q}$ output of the FF2 turns "0" to reset the FF1. At the rising edge of the Q output of the FF2, therefore, the Q output of the FF1 falls. At the succeeding falling edge of the input data D2, the Q output ("0") of the FF1 is set in the FF2 to lower the Q output of the FF2 to "0".

Therefore, the pulse width of the Q output of the FF1, i.e., the pulse width of the output pulse T1 becomes equal to the sum obtained by adding the rising time difference $\Delta T$ between the input data D1 and D2 to half the repetition period of the input data D2. Since the output pulse T2 is the logical product of the Q output of the FF2 and the inverted signal of D2, the pulse width of T2 becomes equal to half the repetition period of D2. Accordingly, the difference in pulse width between T1 and T2 is equal to the difference in rising time between the input data D1 and D2.

By deriving the logical product of the Q output of the FF2 with the input data D2 it is possible to obtain a waveform which does not overlap the output pulses T1 and T2 as shown in FIG. 4 as the output pulse T3.

Figure 5:
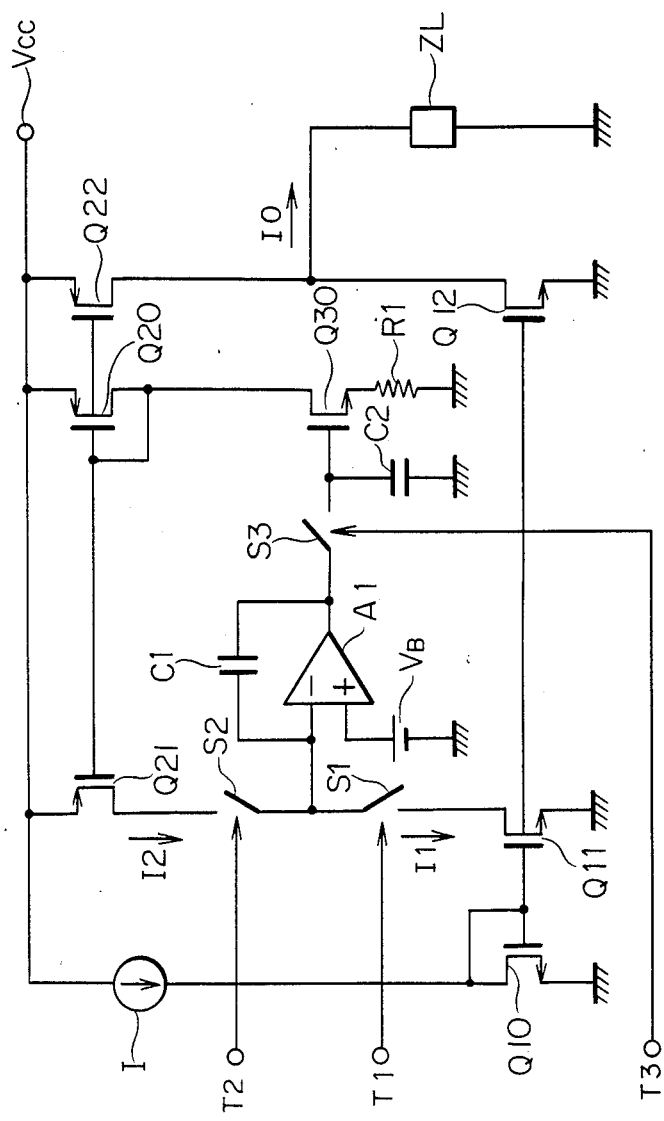
FIG. 5 shows another embodiment of the smoothing filter according to the present invention.

Another embodiment of the smoothing filter according to the present invention will now be described. In FIG. 5, circuit elements which are like those of the embodiment of the smoothing filter according to the present invention as shown in FIG. 1 are represented by identical symbols. The embodiment of FIG. 5 differs from that of FIG. 1 in that the integration currents I1 and I2 are generated by a current mirror circuit and the output signal takes the form of a current.

That is to say, gates of N-type MOS transistors Q10, Q11 and Q12 are connected in common, and the gate of Q10 is connected to the drain thereof to constitute a current mirror circuit. In the same way, gates of P-type MOS transistors Q20, Q21 and Q22 are connected in common, and the gate of Q20 is connected to the drain thereof to constitute a current mirror circuit. The output signal is a current flowing out from a point where the drains of the above described Q12 and Q22 are connected together. Load impedance ZL is connected to this output point.

A reference current source I corresponds to the reference voltage $V_{ref}$ of FIG. 1 and is connected between the voltage supply $V_{cc}$ and the gate and drain of the MOS transistor Q10.

The operation of this embodiment of the smoothing filter connected as described above and used for the present invention will now be described.

In FIG. 5, the MOS transistors Q10 to Q12 constituting the current mirror circuit are made equal to each other in gate area, and the drain currents of respective transistors are made equal to each other. The current at this time is defined by the reference current source I and denoted by I1.

Further, the MOS transistors Q20 to Q22 are made equal to each other in gate area, and the drain currents of respective transistors are made equal to each other. The current at this time is defined by the drain current of a MOS transistor Q30 and denoted by I2.

The above described bias state is similar to the embodiment of the smoothing filter according to the present invention as shown in FIG. 1. Therefore, the operation of the present embodiment with pulses shown in the time chart of FIG. 2 applied thereto is nearly the same as that in the case of FIG. 1.

After the application of the input pulses T1 and T2, the output voltage of the operational amplifier A1 constituting the integrator increases by the voltage $\Delta V$ represented by the expression (1).

This voltage is sampled by a sample and hold circuit composed of a switch S3, a capacitor C2, and a MOS transistor Q30. As a result, the drain current of the transistor Q30 varies and the current I2 of the transistor Q21 also increases by ΔI. This increase ΔI is related to a resistor R1 and represented as $$\Delta I = \frac{\Delta V}{R1}. \quad (8)$$

Assuming that R1 is chosen to be equal to R21, the expression (8) becomes equal to the expression (2), resulting in the operation equivalent to that of the embodiment shown in FIG. 1. Accordingly, the balance condition of the embodiment shown in FIG. 5 is represented by the expression (3).

The output current $I_0$ is equal to the difference between I2 and I1 and represented as $$I_0 = I2 - I1 = \frac{T'1 - T'2}{T'2} \cdot I1 \quad (9)$$

That is to say, the output signal $I_0$ is a current which is in proportion to the difference between the pulse width T'1 of the input pulse T1 and the pulse width T'2 of the input pulse T2. The step response is the same as that of the embodiment shown in FIG. 1.

Thus, in this embodiment of the smoothing filter used for the present invention as well, effects similar to those of the preceding embodiment of the smoothing filter are obtained.

Figure 6:
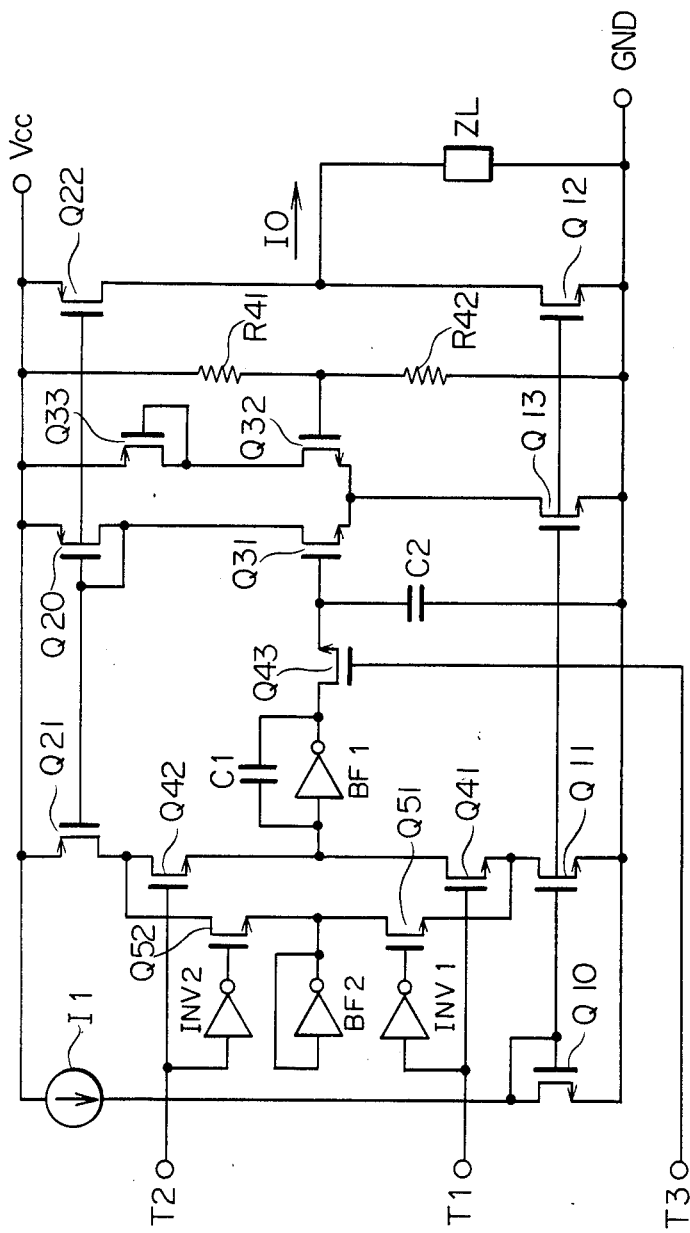
FIG. 6 shows still another embodiment of the smoothing filter according to the present invention.

Another embodiment of the smoothing filter used in the present invention will now be described by referring to FIG. 6. In FIG. 6, circuit elements similar to those of the embodiments of the smoothing filter according to the present invention as shown in FIGS. 1 and 5 are denoted by identical symbols.

The present embodiment of FIG. 6 differs from the embodiment of FIG. 5 in the following three points.

(1) Switches corresponding to S1 to S3 of FIG. 5 are constituted by N-type MOS transistors Q41 to Q43. And N-type MOS transistors Q51 and Q52 are so disposed as to operate with phases respectively opposite to those of Q41 and Q42 under the control of inverters INV1 and INV2 respectively connected to the input terminals T1 and T2. The transistor Q51 is connected between a self-biased inverter buffer BF2 and the drain of the output transistor Q11 of the current mirror. And the transistor Q52 is connected between the inverter buffer BF2 and the drain of the output transistor Q21 of the current mirror.

(2) The operational amplifier A1 constituting the integrator in FIG. 5 is formed by a CMOS inverter buffer BF1.

(3) The circuit for converting the output voltage of the sample and hold circuit into a current is constituted by a differential pair composed of N-type MOS transistors Q31 and Q32. This differential pair is biased by the drain current of Q13 included in the current mirror circuit composed of N-type MOS transistors Q10 to Q13. The gate of Q31 which is one input of the differential pair is connected to the capacitor C2 which is the output point of the sample and hold circuit. The gate of Q31 which is the other input is connected to an intermediate point located between resistors R41 and R42 which are connected in series between VCC and GND.

The difference in operation caused by the above described difference in configuration will now be described.

Since the transistor Q51 operates with a phase opposite to that of Q41, the current of the output transistor Q11 of the current mirror circuit flows alternately through Q41 and Q51. Since the transistor Q52 operates with a phase opposite to that of Q42, the current of the output transistor Q21 of the current mirror circuit flows alternately through Q42 and Q52. Hence the currents of Q11 and Q21 are not switched by the input pulses T1 and T2, resulting in an I·T product with higher precision than that of the embodiment shown in FIG. 5.

Since a CMOS inverter buffer is used as the amplifier constituting the integrator, the present embodiment is suitable to high speed operation. Further, the present embodiment is capable of operating with power supply of low voltage (5V, for example) because a complicated operational amplifier is not necessary.

Since the output of the sample and hold circuit undergoes voltage-to-current (V/I) conversion in the differential circuit, the change ΔI in current of Q21 caused when the output voltage of the sample and hold circuit has changed by ΔV is represented as $$\Delta I = g_m \cdot \Delta V \approx K\sqrt{I13} \cdot \Delta V \quad (10)$$

where I13 is the drain current of Q13 and K is a constant defined by the dimensions of the transistors Q31 and Q32. The symbol $g_m$ denotes mutual conductance of the differential pair composed of Q31 and Q32 (a coefficient in converting voltage into a current).

Accordingly, the loop gain $G_l$ corresponding to the expression (6) is represented as $$G_l = \frac{T'2}{C1} \cdot K\sqrt{I13}. \quad (11)$$

The characteristics of expression (11) is useful when the range of the pulse width T'1 of the input pulse and the (fixed) width of T'2 have varied by changing the frequency setting of the input pulse.

For attaining the fast response and circuit stability, it is necessary to keep the loop gain $G_l$ at nearly unity while keeping the amplitude change of the output voltage of the integrator nearly constant even if the maximum pulse width of the pulses T1 and T2 changes. Therefore, the current of the constant current source I is so established that the current I1 of Q11 and the current I13 of Q13 may have a value which is in inverse proportion to the time of the input pulse T2 (i.e., a value defined by K'/T2, where K' is a constant). As a result, the change of the loop gain $G_l$ is in proportion to the square of the pulse width T'2, and the change of the loop gain $G_l$ can be suppressed. Further, the output amplitude of the integrator can be made nearly constant because the I1·I2 product can be made constant.

If bipolar transistors are used as the transistors Q31 and Q32, the loop gain $G_l$ of the expression (11) is in proportion to I13. Accordingly, it is possible to control the loop gain $G_l$ so as to keep it constant with respect to a change of the input pulse T2.

In this embodiment of the smoothing filter used for the present invention as well, therefore, effects similar to those of the embodiment of the smoothing filter according to the present invention as shown in FIG. 1 are obtained. Even if the maximum value of the input pulse width is defined to be a different value, a fast and stable smoothing filter can be obtained by only changing the setting of the current value to be integrated in the integrator. Further, the present embodiment is suitable to operation with low voltage power supply and is easily fabricated as an LSI because complicated circuits such as operational amplifiers are not used.

Figure 7:
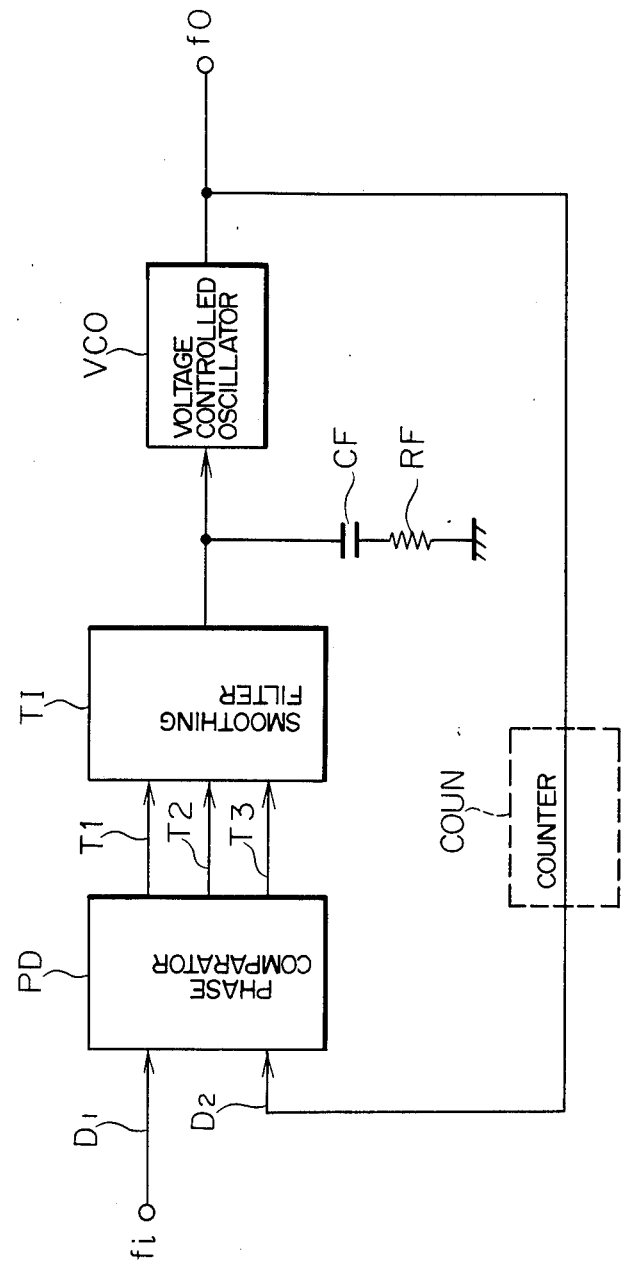
FIG. 7 shows an embodiment of a PLL according to the present invention.

An embodiment of the present invention in which the smoothing filter is separated from the loop filter will now be described by referring to FIG. 7. In FIG. 7, the phase comparator PD is constituted by the circuit as shown in FIG. 3, for example. The phase comparator PD detects the phase difference between the inputs D1 and D2 to send it out in the form of difference in pulse width between the pulses T1 and T2. At this time, the pulse T3 which does not overlap the pulses T1 and T2 is also sent out.

A smoothing filter TI is the circuit shown in FIG. 6, for example. The smoothing filter TI is provided with the pulses T1 to T3 as inputs to send out a current in proportion to the time difference between T'1 and T'2.

A capacitor CF and a resistor RF connected in series between the output of the smoothing filter TI and the ground contitute the loop filter.

A voltage controlled oscillator VCO is an oscillator controlled by the voltage of the loop filter. The output $f_o$ of the VCO is connected to the input D2 of the phase comparator PD. The other input D1 of the PD is connected to an input signal $f_i$.

The phase-locked loop configured as described above operates so that the input frequency $f_i$ may agree with the output frequency $f_o$ in frequency and phase. The smoothing filter TI has fast response property and its output has no ripple. Accordingly, the output frequency $f_o$ also has no ripple. In addition, the loop characteristics are not changed by the smoothing filter. Hence the jitter is not increased, resulting in the realization of a stable PLL having high precision.

By the present embodiment, therefore, the frequency ripple can be advantageously reduced without increasing the jitter.

In the above described embodiment, the output $f_o$ of the voltage controlled oscillator VCO is directly supplied to the phase comparator PD. Even if the output $f_o$ is supplied to the phase comparator PD via a counter COUN, however, the similar effect is obtained. The counter COUN has frequency division function. Since the circuit having frequency division function is inserted, the frequency of the output pulse $f_o$ is raised with respect to the input pulse $f_i$ in accordance with the frequency division ratio.

The above described embodiment provides a phase-locked loop having excellent characteristics. Specifically, the smoothing filter can be disposed apart from the loop filter, for example. It is thus possible to reduce the frequency ripple while keeping the jitter suppressed.

It has been described that the circuits of FIGS. 1, 5 and 6 are smoothing filters. Assuming that the first pulse is included in the first pulse signal train to appear in time series and the second pulse is included in another pulse signal train to appear in time series so as not to overlap in time the first pulse, however, the circuits of FIGS. 1, 5 and 6 can be deemed as a time difference detector circuit for detecting the difference in pulse width between the first pulse and the second pulse. The above described first pulse signal train is composed of the input pulses T1 shown in FIG. 2, for example, and the above described second pulse signal train is composed of the input pulses T2 shown in FIG. 2. Since the output of the integrator is sampled in this time difference detector circuit, it is possible to obtain the output voltage having no ripple. Pulse averaging in the integrator is suitable to fast response because averaging is conducted in the system of proportional elements. Further, the embodiments of FIGS. 1, 5 and 6 are capable of detecting the time difference with high precision without being affected by the characteristics of the sample and hold circuit, because the loop is constituted under such balance condition that the current time products may be equal.

The phase comparator circuit shown in FIG. 3 has no problem when the frequency of the signal handled by the circuit is comparatively low. When a high frequency signal is handled, however, there occurs a problem. The phase comparator circuits according to the present invention are suitable to high frequency operation. Before describing the embodiments of the present invention shown in FIGS. 10, 12 and 14, phase comparator circuits of the prior art will now be described by referring to FIGS. 8 and 9. The circuit shown in FIG. 8 is substantially the same as that of FIG. 3 and is similar to the circuit disclosed in the above described paper, IEEE SAC-1 No. 5 (1983), pp. 723 to 733.

Figure 8:
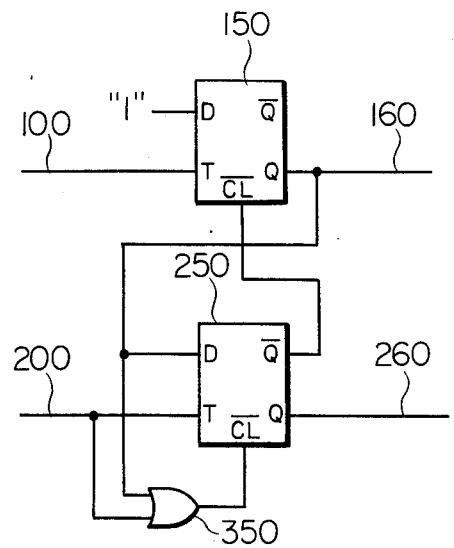
FIG. 8 shows an example of a phase comparator circuit of the prior art.
Figure 9:
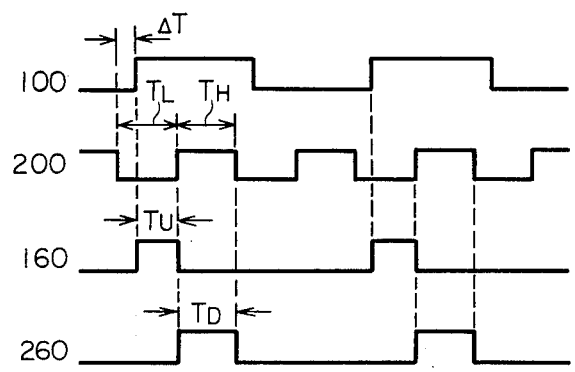
FIG. 9 shows the operation of the circuit illustrated in FIG. 8.

The phase comparator circuit of the prior art is composed of flip-flop circuits 150 and 250 and a 2-input OR circuit 350 as shown in FIG. 8 and operate as shown in FIG. 9. Assuming that the first signal 100 and the second signal 200 have waveforms as shown in FIG. 9, the first output signal 160 becomes "1" at the rising edge of the signal 100, and the second output signal 260 becomes "1" at the rising edge of the signal 200 while the signal 160 stays at "1". When the signal 260 is turned to "1", the flip-flop circuit 150 is cleared to make the signal 160 "0". When both the signal 160 and the signal 200 are "0", the flip-flop circuit 250 is cleared to turn to "0".

Assuming that the duration of "0" state in the signal 200 is $T_L$ and the phase difference is $\Delta T$, the pulse width $T_U$ of the signal 160 is represented as $$T_U = T_L - \Delta T. \tag{12}$$

On the other hand, the pulse width $T_D$ of the signal 260 is equal to the duration $T_H$ of the "1" state in the signal 200. Therefore, the difference between the pulse width $T_D$ and the pulse width $T_U$ can be represented as $$T_D - T_U = \Delta T + T_H - T_L. \tag{13}$$

That is to say, the pulse width difference between $T_D - T_U$ is represented as the sum of the phase difference $\Delta T$ and the time difference $T_H - T_L$. The time difference $T_H - T_L$ varies with the duty ratio of the signal 200 and assumes zero when the duty ratio is 50%. Although the phase difference $\Delta T$ can be derived from the pulse width difference between $T_D - T_U$, therefore, the phase diffference is affected by the duty ratio of the signal 200.

As evident from FIG. 9, the falling edge of the first output signal and the rising edge of the second output signal 260 appear substantially at the same time. In high speed operation, therefore, the signals 160 and 260 interfere each other, the pulse width $T_U$ and $T_D$ being changed.

In the configuration of the phase comparator circuit of the prior art, attention is thus not paid to the duty ratio of the second input signal and the mutual interference between the first and second output signals. Accordingly, the detected phase difference signal was affected by these problems and hence the realization of a phase comparator circuit capable of operating at high speed was difficult.

An embodiment of the present invention will now be described by referring to FIGS. 10 and 11.

Figure 10:
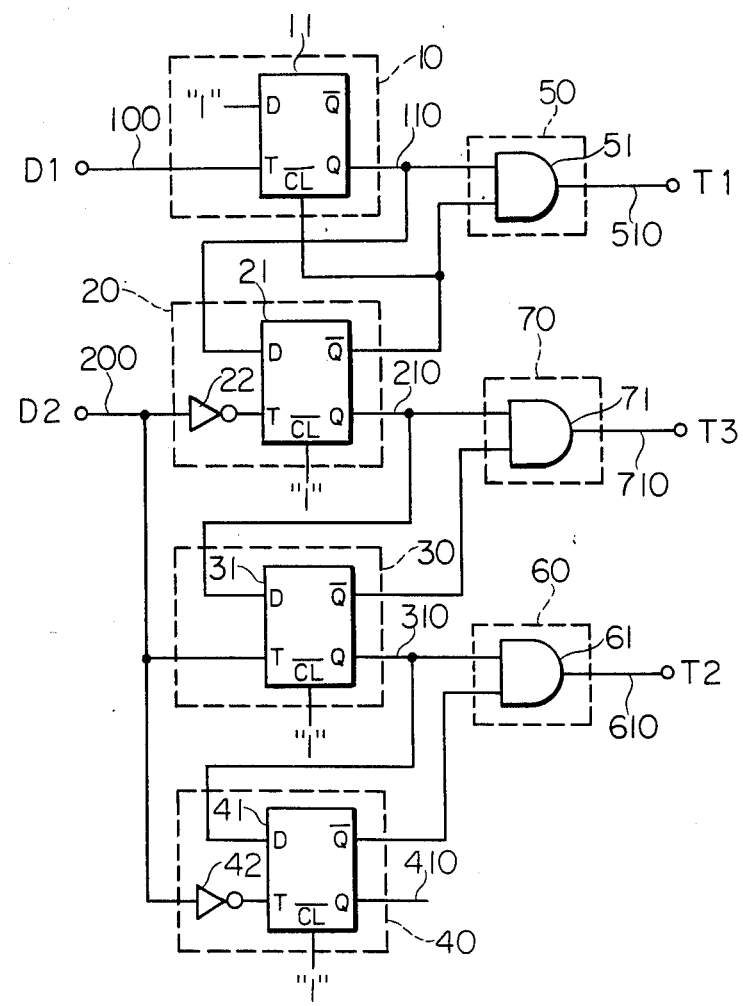
FIGS. 10, 12 and 14 show embodiments of a phase comparator circuit according to the present invention.
Figure 11:
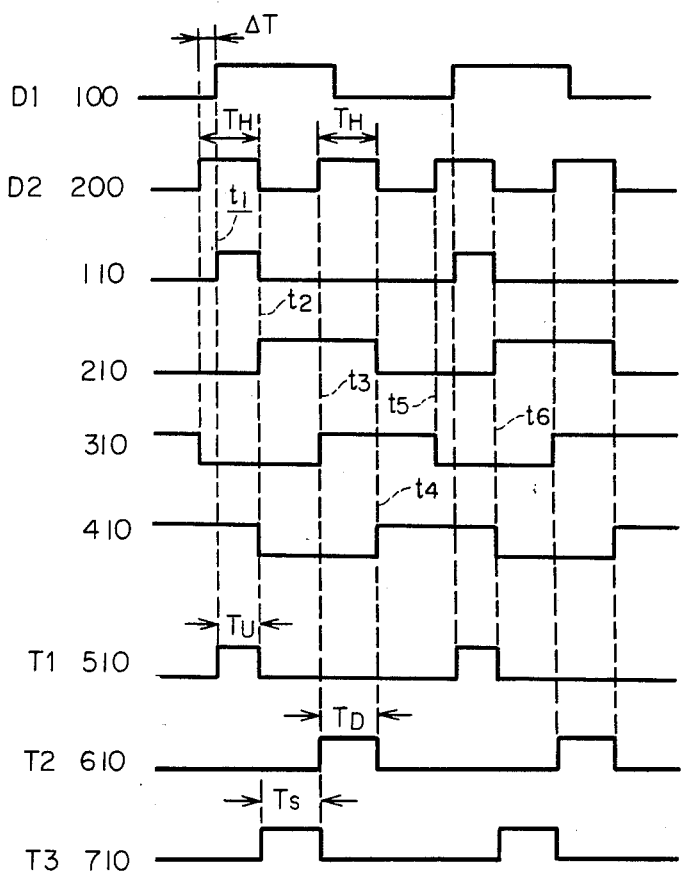
FIGS. 11, 13 and 15 show the operation of the circuits illustrated in FIGS. 10, 12 and 14, respectively.

As shown in FIG. 10, the present embodiment is composed of a circuit 10 for detecting the level change point $t_1$ of the first signal 100, circuits 20, 30 and 40 respectively for detecting the first to third change points $t_2$ to $t_4$ of the second signal 200, a circuit 50 for detecting the time difference between the change points $t_1$ and $t_2$, and a circuit 60 for detecting the time difference between the change points $t_3$ and $t_4$. The circuits 10 to 60 are constituted by flip-flops 11, 21, 31 and 41, inverters 22 and 42, and 2-input AND gates 51 and 61. The circuits 10 to 60 operate as shown in FIG. 11. Signals T1 and T2 sent out from outputs 510 and 610 of the AND gates 51 and 61 can be used as the input pulses T1 and T2 shown in FIGS. 1 to 7 and are denoted by the same names. A circuit 70 of FIG. 10 is connected to the circuits 20 and 30 to detect the time difference between the level change points $t_2$ and $t_3$ and is composed of a 2-input AND gate 71. The signal sent out from the output 710 of the AND gate 71 can be used as the control pulse T3 shown in FIGS. 1 to 7 and is provided with the same name.

In each flip-flop circuit, the state of the D input is set to appear at the Q output at the rising edge of the T input terminal. When the $\overline{CL}$ input terminal is "0", the Q output turns to "0". The $\overline{Q}$ output always assumes a state opposite to that of the Q output.

The Q output 110 of the flip-flop 11 turns to "1" at the rising edge of the signal 100 to detect the level change point $t_1$ of the first signal.

The T input terminals of the flip-flops 21 and 41 are connected to the signal 200 via inverters 22 and 42, respectively. Therefore, the flip-flops 21 and 41 operate at the falling edge of the signal 200.

Since the Q output signal 110 is supplied to the D input terminal of the flip-flop 21, the Q output 210 turns to "1" at the falling edge of the signal 200 after the level change point $t_1$ and detects the first level change point $t_2$ of the second signal.

Since the Q output 210 is supplied to the D input terminal of the flip-flop 31, the Q output 310 turns to "1" at the rising edge of the signal 200 to detect the second level change point $t_3$ of the second signal.

Since the Q output 310 is supplied to the D input terminal of the flip-flop 41, the Q output 410 turns to "1" at the falling edge of the signal 200 to detect the third level change point $t_4$ of the second signal.

Since the Q output 110 of the flip-flop 11 is reset when the Q output of the flip-flop 21 has turned to "0", then the Q output 210 is "0" when, the Q out-put 210 is "1". At succeeding level change points of the signal 200, the Q outputs 210, 310 and 410 respectively of the flip-flops 21, 31 and 41 turn to "0" one after another. That is to say, the outputs 210, 310 and 410 turn to "0" at the falling edge $t_4$ of the signal 200, the rising edge $t_5$ of the signal 200, and the falling edge $t_6$ of the signal 200, respectively.

When the Q output 110 of the flip-flop 11 is "1" and the $\overline{Q}$ output of the flip-flop 21 is "1" (i.e., the Q output 210 is "0"), the output 510 of the 2-input AND gate 51 becomes "1". When the Q output 310 of the flip-flop 31 is "1" and the $\overline{Q}$ output 410 of the flip-flop 41 is "0", the output 610 of the 2-input AND circuit 61 becomes "1".

That is to say, the pulse width of the output 510 is the time difference between the level change points $t_1$ and $t_2$, and the pulse width of the output 610 is the time difference between the level change points $t_3$ and $t_4$.

Therefore, the pulse width $T_U$ of the output 510 becomes the difference between the duration $T_H$ of the state "1" in the signal 200 and the phase difference $\Delta T$ and is represented as $$T_U = T_H - \Delta T \tag{14}$$

On the other hand, the pulse width $T_D$ of the output 610 is equal to the duration $T_H$ and hence represented as $$T_D = T_H \tag{15}$$

From the expressions (14) and (15), the phase difference $\Delta T$ is represented as $$\Delta T = T_D - T_U. \tag{16}$$

As evident from the expression (16), the phase difference $\Delta T$ can be stably detected as the pulse width difference $T_D - T_U$ between the signals 510 and 610, even if $T_H$ changes due to the duty ratio of the signal 200. Since the change point of the output 510 is not concurrent with the change point of the output 610, there is no influence of mutual interference between signals.

In addition, the level change point $t_1$ of the signal 100 and the first to third level change points $t_2$ and $t_3$ can be detected by the same kind of flip-flop circuits 11, 21, 31 and 41. Accordingly, respective change points can be detected with equal delays. Hence the pulse widths $T_U$ and $T_D$ of the signals 510 and 610 are not affected by the operation delay of the flip-flop.

When the present embodiment is used as described above, the detected phase difference is not varied by the duty ratio of the second input signal and the mutual interference between the output signals, resulting in the realization of a phase comparator circuit having a reduced error.

Further, it is advantageously possible to realize a phase comparator circuit of high speed operation because the detected phase difference does not depend upon the operation delay of the flip-flop circuit.

When the Q output 210 of the flip-flop 21 is "1" and the Q output of the flip-flop 31 is "0" (i.e., the $\overline{Q}$ output is "1"), the output 710 of the 2-input AND gate 71 turns to "1". That is to say, the output 710 becomes "1" during the period between the level change points $t_2$ and $t_3$ and is used to drive the switch S3 of the embodiments of FIG. 1 and FIGS. 5 to 7. When the phase comparator circuit of FIG. 3 is used to drive the smoothing filter, switches S1, S2 and S3 are driven respectively by pulses T1, T2 and T3 to operate in the order of S1, S2 and then S3. One cycle is thus composed of charging the integrator circuit, discharging the integrator circuit and the sample and hold operation effected in this order. This cycle is repeated. When the smoothing filter is driven by the output of the phase comparator circuit of FIG. 10, switches are driven in the order of S2, S1 and S3. Accordingly, it is considered that a cycle of the smoothing circuit is constituted by discharging the integrator circuit, charging the integrator circuit, and sample and hold operation carried out in this order.

Another embodiment of the present invention will now be described by referring to FIGS. 12 and 13.

The present embodiment differs from the embodiment of FIG. 10 of the present invention in the configuration of a circuit 20' for detecting the first level change point of the second input signal 200 and a circuit 40' for detecting the third level change point of the signal 200. The element having the same function as that of the corresponding element of FIG. 10 is denoted by the same symbol.

The Q output 110 of the flip-flop circuit 11 and the first input signal 100 are connected to the D input 240 of the flip-flop circuit 21 included in the circuit 20 via a 2-input OR circuit 24. The input signal 100 passed through an inverter circuit 25 and the Q output 310 of the flip-flop 31 are connected to the $\overline{CL}$ input of the flip-flop 21 via a 2-input NAND circuit 26. As signals corresponding to $\overline{Q}$ outputs of the flip-flops 21 and 41, Q outputs of the flip-flop 21 and 41 are sent out via inverter circuits 23 and 43, respectively.

The operation of the present embodiment according to the present invention configured as described above will now be described by referring to the operation timing chart of FIG. 13.

Figure 13:
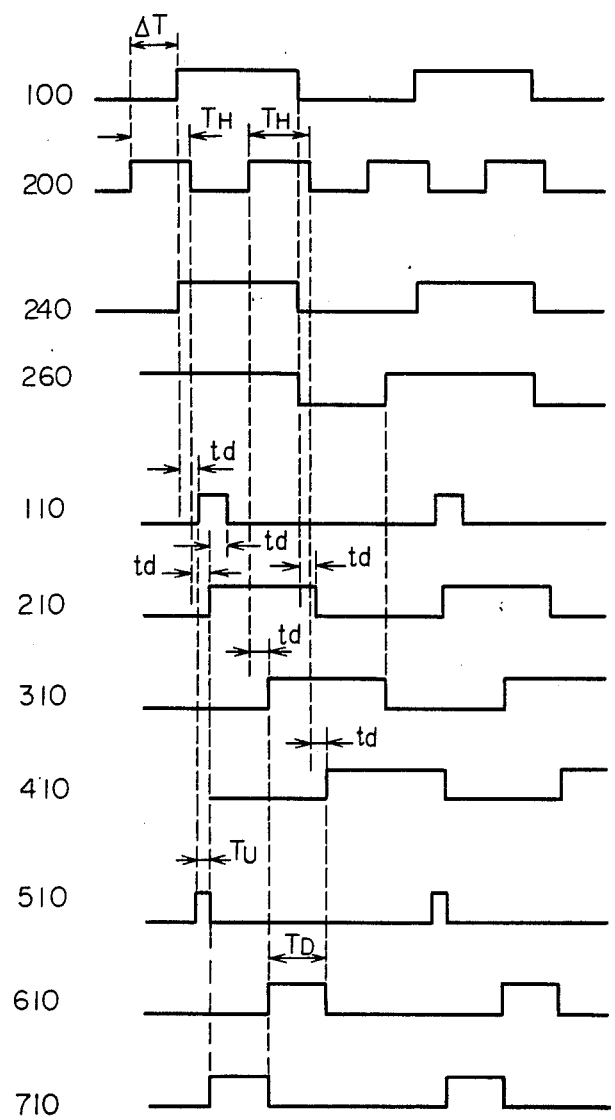

In FIG. 13, the phase difference between the first input signal 100 and the second input signal 200 is denoted by $\Delta T$, and the delay time of the flip-flop 11, 21, 31 and 41 is denoted by $t_d$.

The D input 240 of the circuit 20' is the logical sum of the first signal 100 and the Q output 110. Under the condition of FIG. 13, the D input 240 is equivalent to the first signal 100. The $\overline{CL}$ input 260 of the flip-flop 21 is the inverted signal of the logical product between the inverted signal of the first signal 100 and the Q output 310. When the first signal 100 is "1", the $\overline{CL}$ input 260 turns to "1" and the flip-flop 21 is not cleared.

The flip-flop 21 operates at the falling edge of the second signal 200. When the first signal 100 is "1" and $t_d$ has elapsed since the falling edge of the second signal, therefore, the Q output 210 of the flip-flop 21 is inverted to "1". Thereby the circuit 20' is able to detect the first level change point of the second signal 200.

The operation of the circuit 10 for detecting the level change point of the first signal 100 and the operation of circuits 30 and 40' for detecting the second and third level change points of the second signal are basically the same as those of the embodiment according to the present invention shown in FIG. 10.

That is to say, the Q output 110 of the circuit 10 is inverted to "1" when $t_d$ has elapsed since the rising edge of the first signal 100. And the Q output 110 turns to "0" when $t_d$ has elapsed since the falling edge of the $\overline{Q}$ output of the flip-flop 21 (i.e., since the rising edge of the Q output 210).

The Q output 210 of the circuit 20' turns to "1" when $t_d$ has elapsed since the falling edge of the second signal. And the Q output 210 turns to "0" when $t_d$ has elapsed since the falling edge of the $\overline{CL}$ input 260.

When $t_d$ has elapsed since the rising edge of the second signal 200 while the Q output 210 is "1" or "0", the Q output 310 of the circuit 30 turns to "1" or "0". When $t_d$ has elapsed since the falling edge of the second signal while the Q output 310 is "1" or "0", the Q output 410 of the circuit 40' is inverted to "1" or "0".

As described above, the level change point of the first signal and the first to third level change points of the second signal can be detected by the circuits 10, 20', 30 and 40' when the operation delay time $t_d$ of the flip-flop has elapsed. In the present embodiment as well, therefore, the effect similar to that of the embodiment shown in FIG. 10 is obtained.

Further, the rising edge of the first signal 100 is set in the flip-flop 22 at the timing of the falling edge of the second signal 200 in the present embodiment. Owing to this scheme, even in the vicinity of the phase $\pm \pi$, the phase difference can be correctly detected, to an advantage.

Figure 12:
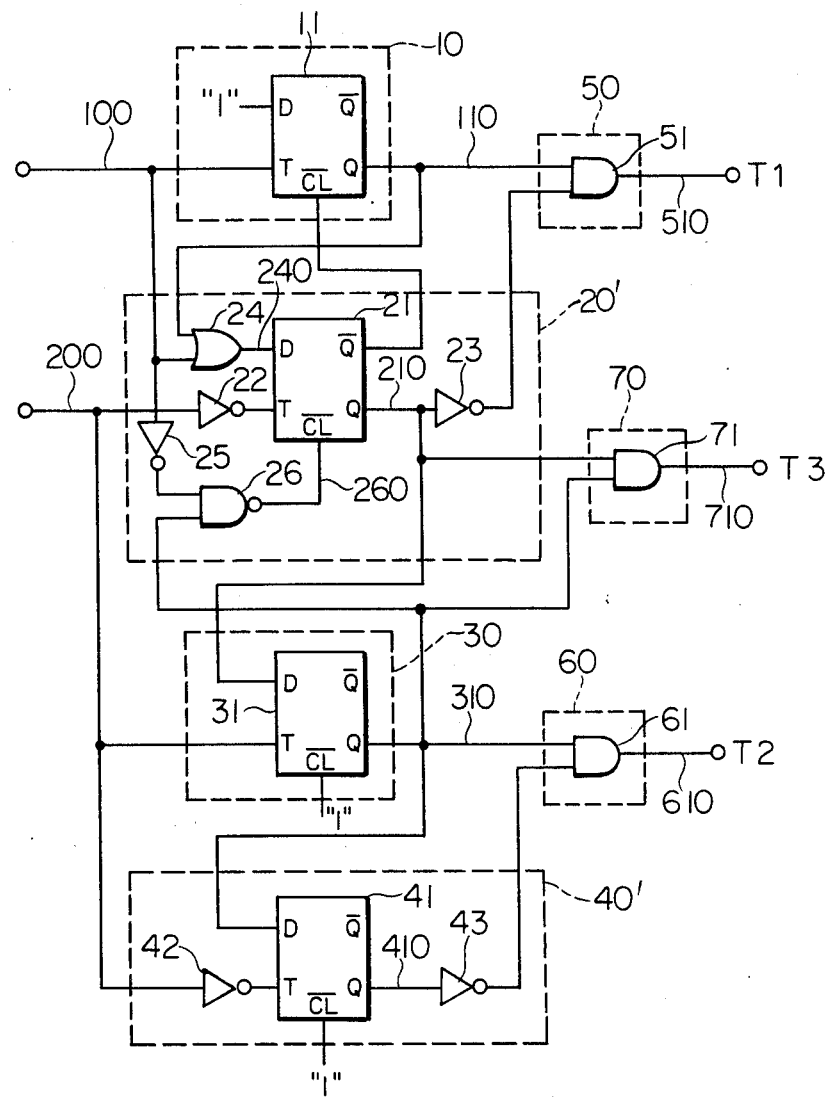

If the duration of the state "1" of the first signal 100 is short in the embodiment of FIG. 12, the falling edge of the second signal is sometimes absent during that duration. Although in this case the circuit 10 operates, other circuits do not operate, resulting in false operation. An OR gate 24 is provided to prevent this false operation. The Q output signal 110 is supplied to the D input of the flip-flop 21 via the OR gate 24 so as to ensure the operation of the circuit 20 if the circuit 10 has operated.

Figure 14:
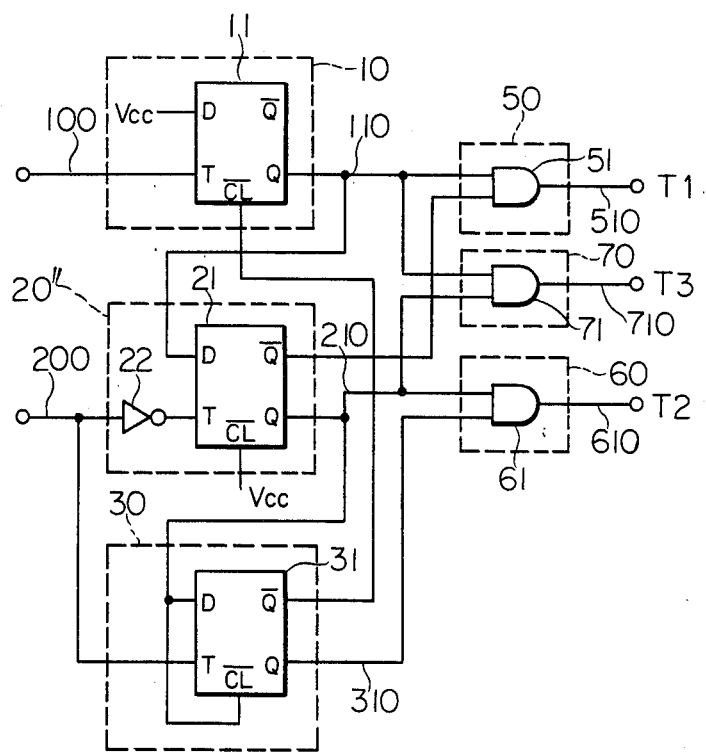

Another embodiment of the present invention will now be described by referring to FIGS. 14 and 15.

The configuration of the present embodiment differs from the embodiment of the present invention shown in FIG. 10 in that a circuit 20" for detecting the first level change point of the second signal also includes a circuit for detecting the third level change point. The element having the same function as the corresponding element of FIG. 10 is denoted by the same symbol.

The operation of the present embodiment will now be described by referring to FIG. 15.

Figure 15:
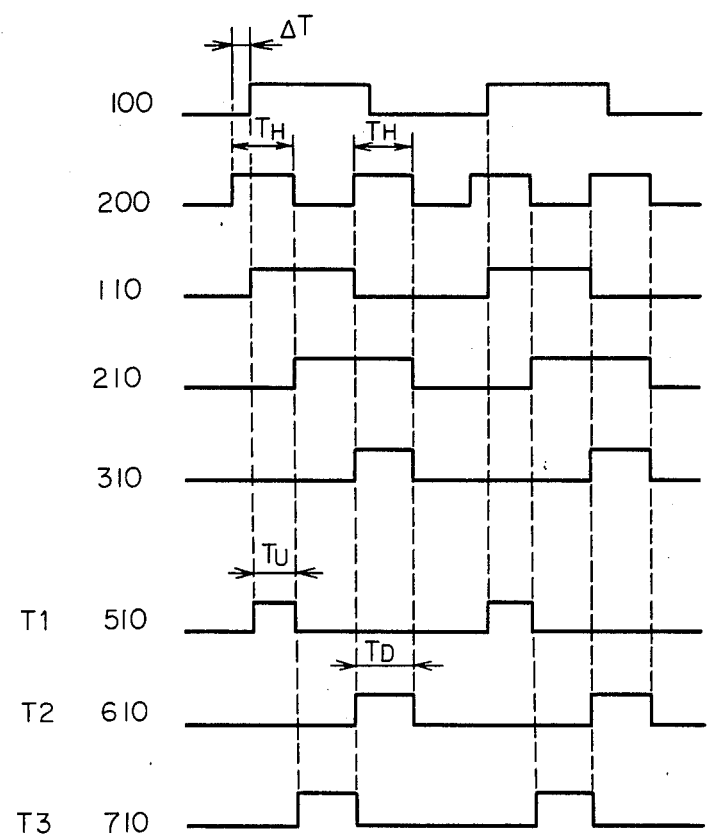

FIG. 15 is shown under the condition that the signal 100 of FIG. 10 is delayed by $\Delta T$ with respect to the second signal.

The Q output 110 of the circuit 10 is inverted to "1" at the rising edge of the first signal 100 and is inverted to "0" when the Q output 310 of the circuit 30 has turned to "1". The Q output 210 of a circuit 20" is inverted to "1" at the falling edge of the second signal while the Q output 110 is "1", and is inverted to "0" at the succeeding falling edge of the second signal. The Q output 310 of the circuit 30 is inverted to "1" at the rising edge of the second signal while the Q output 210 is "1", and is cleared to be "0" when the Q output 210 is "0".

As described above, the level change point of the first signal is detected by the circuit 10, and the first and third level change point of the second signal appearing after the level change point of the first signal are detected by the circuit 20". The second level change point of the second signal can be detected by the circuit 30.

In the present embodiment as well, therefore, the effect similar to that of the embodiment according to the present invention shown in FIG. 10 is obtained.

In the above described embodiment, the detected phase is changed by neither the duty ratio of the input signal nor the mutual interference of the output signals. Accordingly, it is possible to realize a stable phase comparator circuit producing reduced errors. Since the detected phase is not affected by the operation delay of the flip-flop circuit, it is also possible to realize a phase comparator circuit of high speed operation.

An embodiment of a PLL according to the present invention having a frequency acquisition detector circuit, a phase difference detector circuit and a mode control circuit will now be described by referring to drawings.

Figure 16:
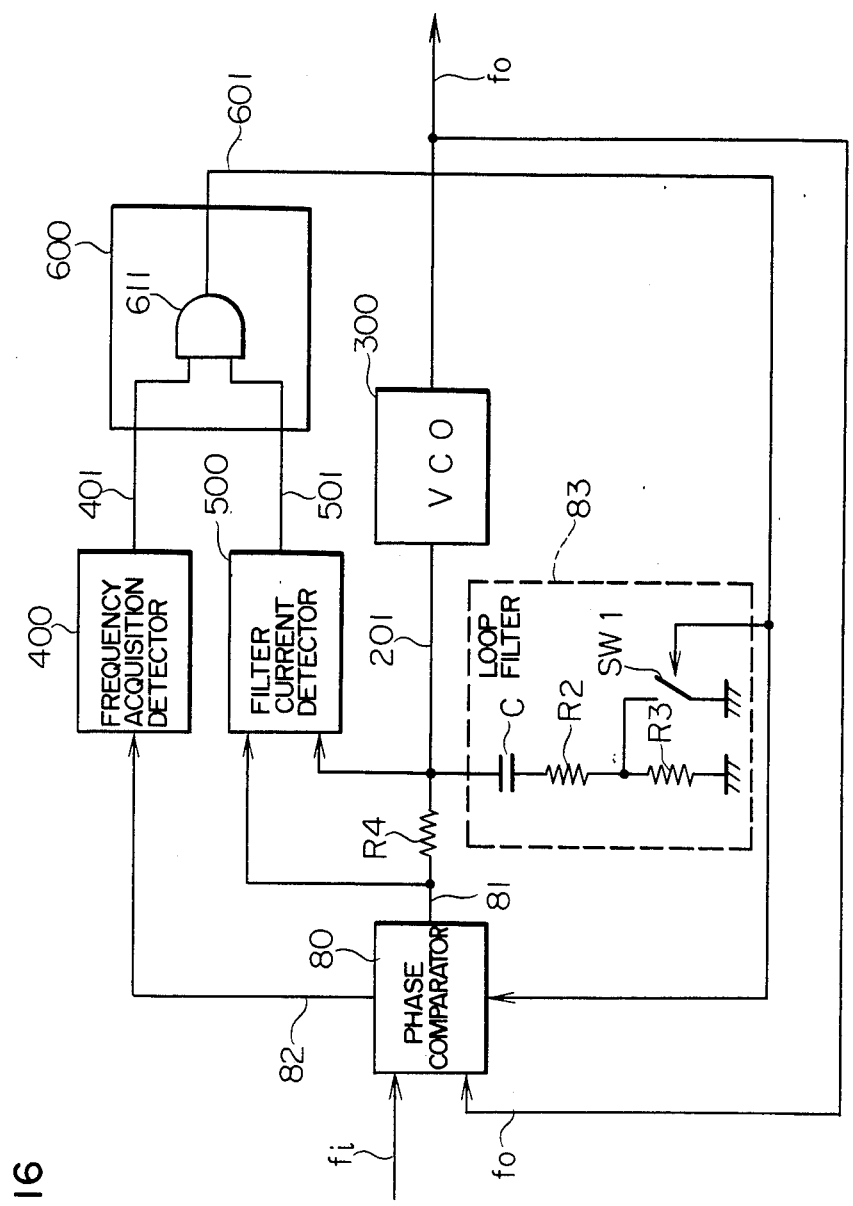
FIG. 16 shows an embodiment of a PLL according to the present invention.

In FIG. 16, a phase comparator circuit 80 is supplied with an input signal $f_i$ and an output signal $f_o$, and sends out phase difference signals 81 and 82. The phase difference signal 81 has conversion gains $G_1$ and $G_2$ ($G_1 > G_2$) and can be controlled by an operation mode signal 601. That is to say, $G_1$ is selected during the acquisition or pull-in, and $G_2$ is selected during the jitter suppression after the completion of the acquisition. The phase difference signal 81 is supplied to a loop filter 83 via a resistor R4. The loop filter 83 is composed of a capacitor C and resistors R2 and R3. The resistor R3 is short-circuited by a switch SW1 controlled by the operation mode signal 601. On the basis of the output signal 201 of the loop filter, a VCO 300 sends out the frequency signal $f_o$. When the phase difference signal is continuously kept below a predetermined value for a predetermined period, it is determined by a frequency acquisition detector circuit 400 that the frequency has been acquired or pulled-in. A frequency acquisition signal 401 is thus turned to "1". A filter current detector circuit 500 is supplied with voltage across the resistor R4 to detect the phase difference. When the absolute value of the voltage across the resistor R4 becomes below a predetermined value, a filter current detection signal 501 is turned to "1". In a mode control circuit 600, the logical product of the frequency acquisition signal 401 and the filter current detection signal 501 is derived by an AND gate 611 to send out a mode changeover signal 601.

Figure 17:
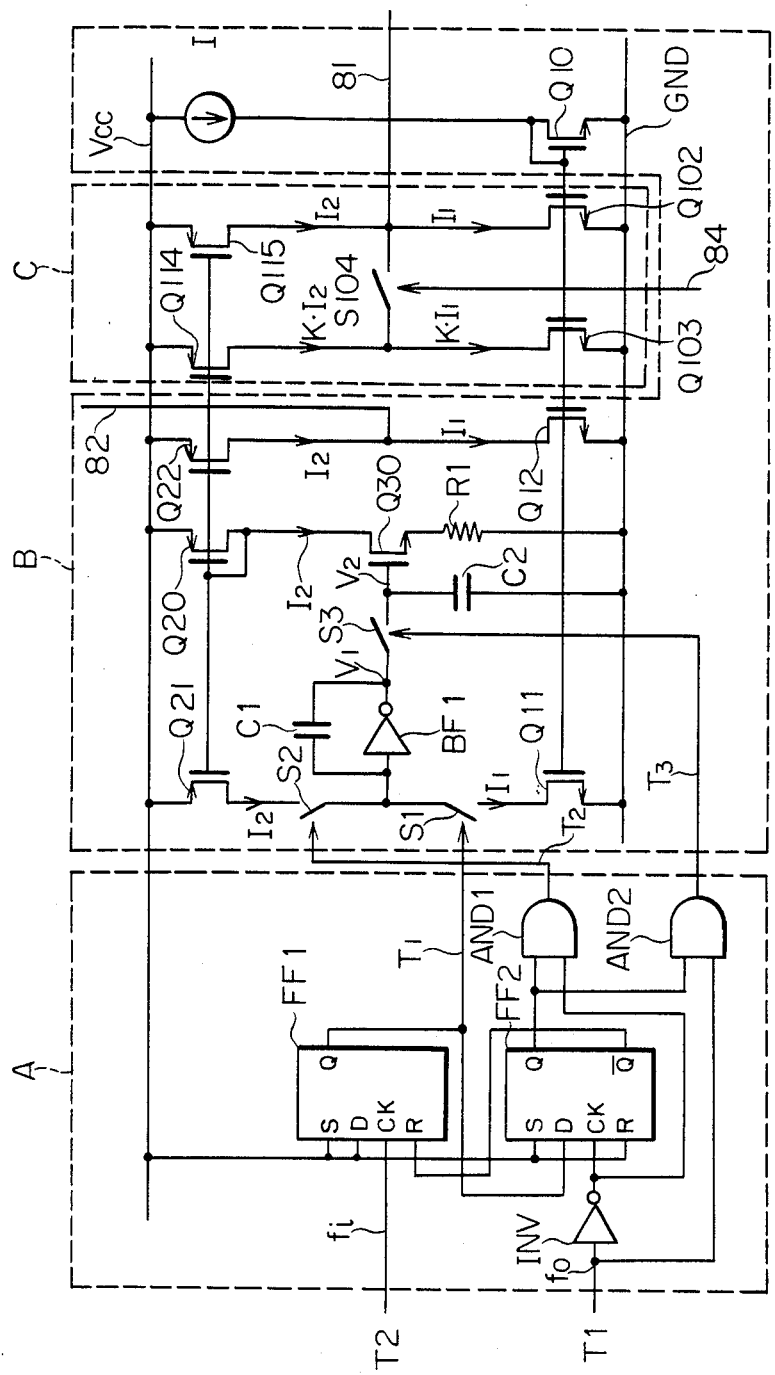
FIGS. 17 and 18 show an embodiment of a phase comparator illustrated in FIG. 16 and its operation time chart, respectively.
Figure 18:
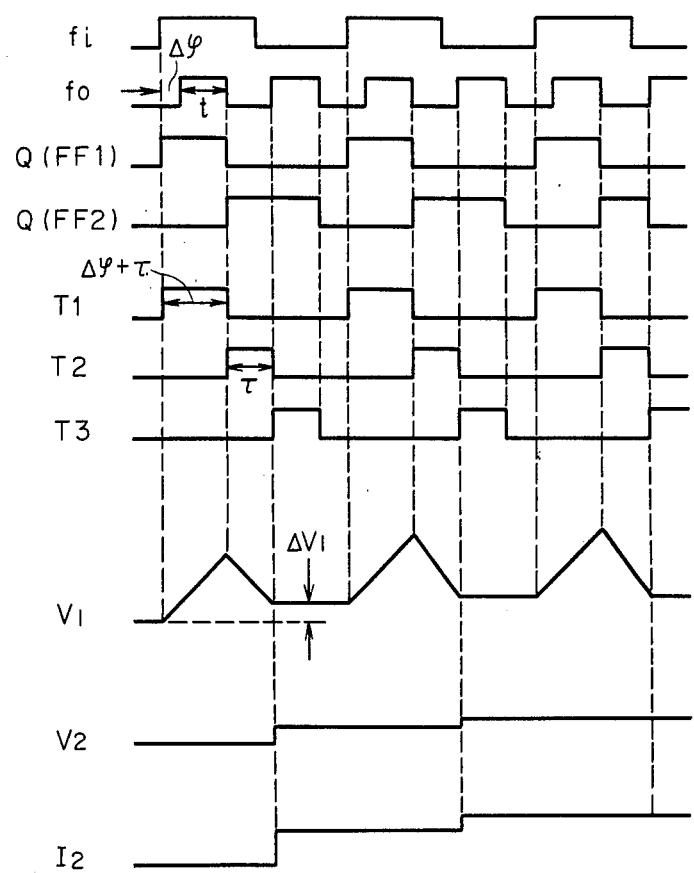

Details of the aforementioned components will now be described. FIG. 17 shows an embodiment of the phase comparator 80, and FIG. 18 is the timing chart for illustrating the operation of that embodiment.

In FIG. 17, a block A surrounded by broken lines is the same phase comparator circuit as that described with reference to FIG. 3. A circuit block B surrounded by broken lines converts the pulse width difference between the pulses T1 and T2 into a current representative of the pulse width difference. Although the block A controls the circuit block B, detailed description of the block A will be omitted.

The output frequency $f_o$ of the VCO is a continuous clock signal having a duty ration of 50% and is twice in frequency the fundamental frequency of the input signal $f_i$. The time difference $\Delta\phi$ between rising edges of the input signal $f_i$ and the output signal $f_o$ is given by the pulse width difference between the pulse signals T1 and T2 as $(\Delta\phi+\tau)-\tau=\Delta\phi$. The sample pulse T3 has a waveform which does not overlap the pulse signals T1 and T2.

In FIG. 17, the circuit of FIG. 3 is shown as the phase comparator circuit of the block A. However, it is a matter of course that the circuit of FIGS. 10, 12 or 14 can be used. The operation speed of the PLL can be raised as described before by using the circuit of FIGS. 10, 12 or 14.

Blocks B and C surrounded by broken lines and used for converting the pulse width difference between the above described pulse signals T1 and T2 will now be described.

The block B is the same as the smoothing filter shown in FIG. 5 excepting the integrator composed of an operational amplifier A1, a power source $V_B$ connected between the noninverting input and the ground, and a capacitor C1 connected between the output of A1 and the inverting input of A1. In FIG. 17, this integrator is composed of an inverting amplifier BF1 and a capacitor C1' connected between the input and output of the BF1. Further description of the block B will be omitted.

The block C is a circuit for changing over the conversion gain of the phase difference signal 81 between G1 and G2 under the control of the operation mode signal 84. Gates of PMOS transistors Q114 and Q115 are connected in common with the gate of a PMOS transistor Q20. Gates of NMOS transistors Q103 and Q102 are connected in common with the gate of an NMOS transistor Q10. Drains of Q114 and Q103 are connected together and drains of Q115 and Q102 are connected together. A switch 104 is controlled by an operation mode control signal 84 and connected between the coupling point of drains of Q114 and Q103 and the coupling point of drains of Q115 and Q102. A phase difference signal 81 is sent out from the coupling point of drains of Q115 and Q102.

As for gate areas of transistors Q10 to Q12, Q102 and Q103 constituting a current mirror circuit, the gate area of the transistor Q103 is made K times that of each of the other transistors and the gate areas of the other transistors Q10 to Q12 and Q102 are made equal to each other. As for gate areas of transistors Q20 to Q22, Q114 and Q115 constituting a current mirror circuit, the gate area of the transistor Q114 is made K times that of each of the other transistors Q20 to Q22 and Q115 and the gate areas of the other transistors Q20 to Q22 and Q115 are made equal to each other. When the pulse T1 is "1", an analog switch S1 is closed and the output V1 of an inverting amplifier BF1 constituting the integrator rises up. When the pulse T2 is "1", the switch S2 is closed to lower the output $V_1$. As a result, a change $\Delta V_1$ in the output $V_1$ of the inverting amplifier BF1 can be represented as $$\Delta V_1 = \frac{(\tau + \Delta\phi) \cdot I_1 - (\tau) \cdot I_2}{C1} \quad (17)$$

where $\tau+\Delta\phi$ and $\tau$ are pulse widths of the above described pulse signals T1 and T2, and $I_1$ and $I_2$ are currents of respective current mirror circuits. C1 is capacitance of a capacitor C1. In a sample and hold circuit composed of a switch S3 and a capacitor C2, the change $\Delta V_1$ is sampled and held by a sample pulse T3. As a result, the ripple is removed as indicated by $V_2$ of FIG. 18. The output $V_2$ of the sample and hold circuit is converted into the current $I_2$ by a V/I converter circuit composed of a transistor Q30 and a resistor R1. As a result, $V_2$ and hence $I_2$ increase when $\Delta V_1$ has increased. When $I_2$ has increased, $\Delta V_1$ decreases as indicated by the expression (17). If the integration by the pulse signals T1 and T2 is repeated, therefore, $\Delta V_1$ of the expression (17) approaches zero. The balance condition is represented as $$T'1 \cdot I_1 = T'2 \cdot I_2 \quad (18)$$

where T'1 and T'2 are pulse widths of the pulses T1 and T2, and are equal to $t+\Delta\phi$ and $\tau$, respectively.

As a result, the current of the phase difference signal 81 and the current of the phase difference signal 82 $I_2$ (OFF) with a switch S104 open is represented as $$I_2 \text{ (OFF)} = \frac{T'1 - T'2}{T'2} \cdot I_1 = \frac{\Delta\phi}{T'2} \cdot I_1 \quad (19)$$

The current $I_2$ (ON) of the phase difference signal 81 with the switch S104 closed is represented as $$I_2 \text{ (ON)} = \frac{T'1 - T'2}{T'2} \cdot (1 + k) \cdot I_1 = \frac{\Delta\phi}{T'2} I_1 (1 + k) \quad (20)$$

As evident from the expressions (19) and (20), the phase difference signals 81 and 82 become currents proportionate to the pulse width difference $\Delta\phi$ between the pulse signals T1 and T2. Phases of the signals $f_i$ and $f_o$ can be thus detected. Further, the level of the signal 81, i.e., the conversion gain of this signal is varied by the ON/OFF operation of the switch S104 under the control of the operation mode signal 84.

Figure 19:
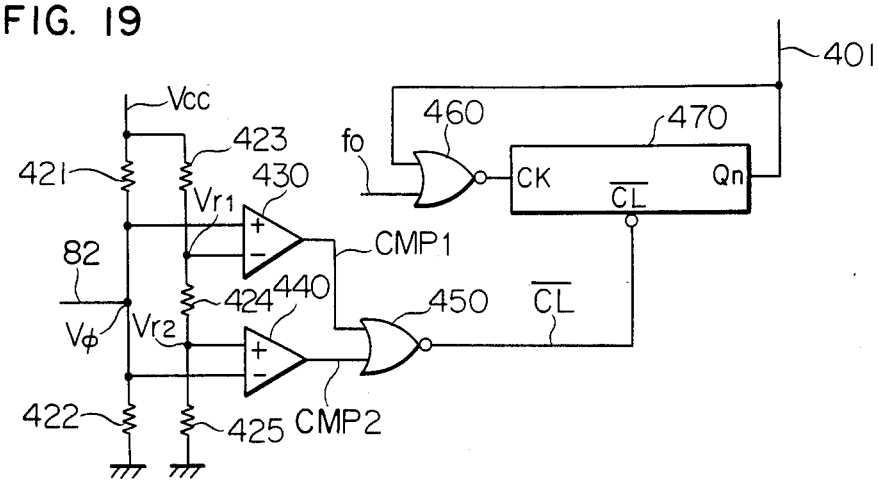
FIGS. 19 and 20 show an example of a frequency acquisition detector circuit illustrated in FIG. 16 and its operation time chart, respectively.
Figure 20:
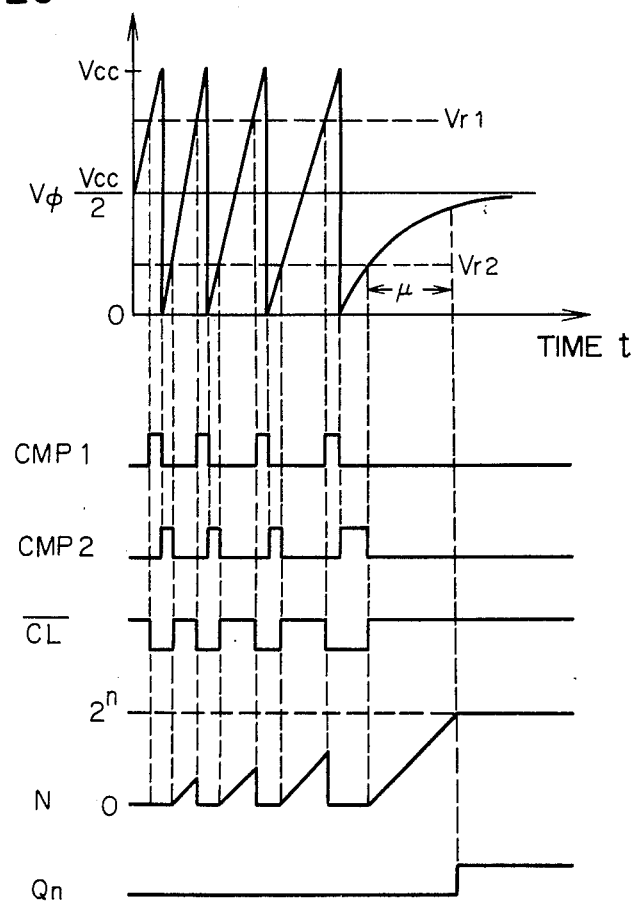

FIG. 19 shows an embodiment of the frequency acquisition detector circuit 400 and FIG. 20 shows the timing chart of its operation. Since in these figures the phase difference signal (current) 82 is in proportion to the phase difference between the signals $f_i$ and $f_o$, the voltage $V\phi$ at the coupling point of resistors 421 and 422 is also in proportion to this phase difference. When $V\phi$ is larger than threshold voltage $Vr_1$, the output CMP1 of a comparator 430 turns to "1". When $V\phi$ is smaller than threshold voltage $Vr_2$, the output CMP2 of a comparator 440 turns to "1". When CMP1 or CMP2 is "1", the output $\overline{CL}$ of a NOR gate 450 assumes "0" to reset a counter 470. The counter 470 counts pulses of the output signal $f_o$ when $\overline{CL}$ is "1" and n-bit output $Q_n$ is "0". When $Q_n$ has turned to "1", the counter 470 stops its counting operation. When $\overline{CL}$ is "1", therefore, the count N in the counter 470 increases with the elapse of time and turns to 0 when $\overline{CL}$ has turned to "0". If $\overline{CL}$ continues to be "1" until the count in the counter reaches $2^n$, $Q_n$ turns to "1" to stop the counting operation in the counter. In the frequency acquisition process, the period until $\overline{CL}$ turns to "1" is short and $\overline{CL}$ continues to be "1" after frequency acquisition. If the period $\mu$ until the count in the counter 470 reaches $2^n$ is chosen so as to be greater than the period until $\overline{CL}$ reaches "1" in the frequency acquisition process, the frequency acquisition can be detected at the output $Q_n$ of the counter 470.

Figure 21:
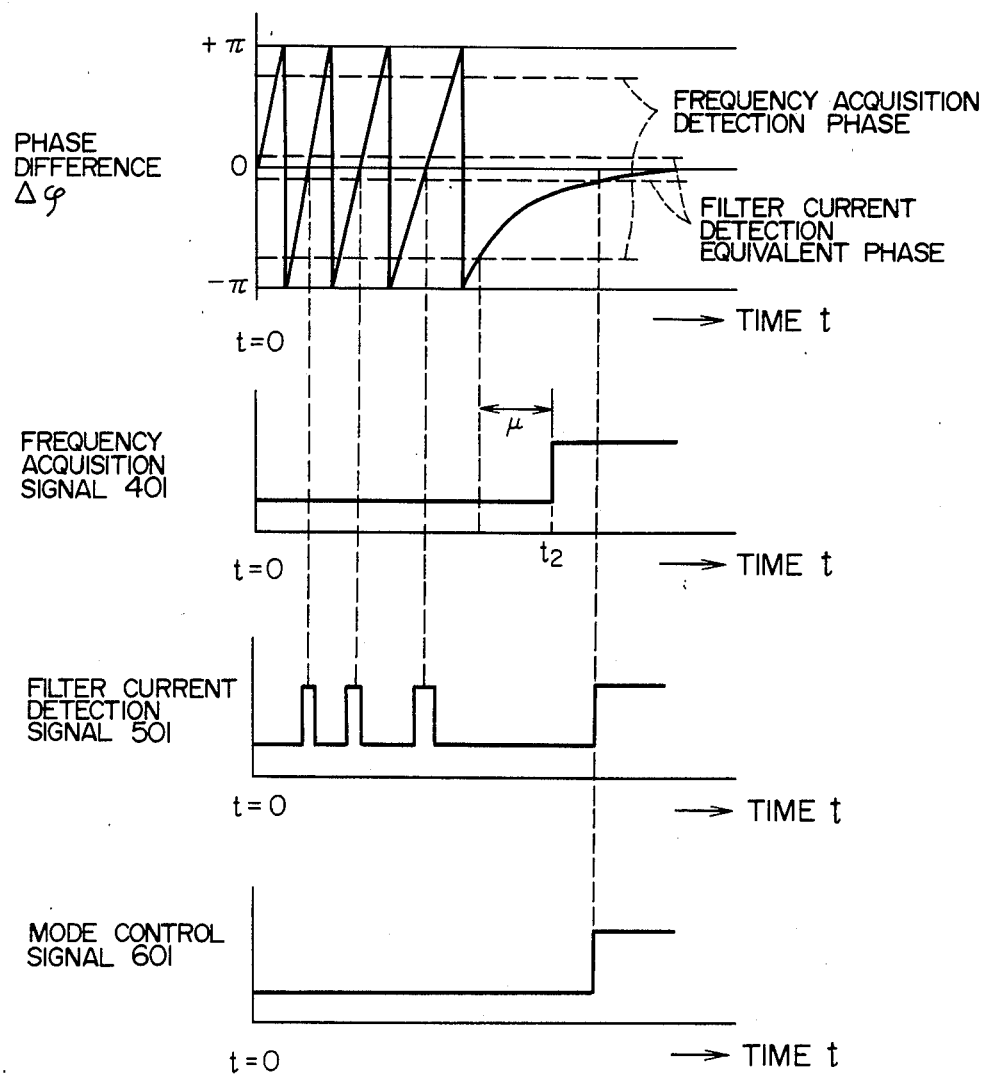
FIG. 21 shows the operation time chart of the PLL illustrated in FIG. 16.

The operation of the embodiment of FIG. 16 configured as described above will now be described by referring to operation waveforms shown in FIG. 21. FIG. 21 shows the change of the phase difference $\Delta\phi$ between the signal $f_i$ and the signal $f_o$ in the acquisition synchronization process and various signals at this time. The PLL acquires or pulls in the input signal by passing through the frequency acquisition process during which the phase difference repetitively varies between $-\pi$ and $+\pi$ and the phase synchronization process during which the phase difference settles from $-\pi$ to nearly zero. Assuming that the phase difference $\Delta\phi$ has been continuously below the frequency acquisition detection position for a duration $\mu$ at time $t_2$, the frequency acquisition signal 401 in the synchronization process turns to "1" at the time $t_2$. The duration $\mu$ is a value not less than the repetition period of the beat frequency generated between the input signal and the output signal, and has been described with reference to FIG. 19.

The filter current detection signal 501 turns to "1" when the phase difference $\Delta\phi$ (or the current corresponding to it) has become less than the phase equivalent to the filter current detection of FIG. 21. The value of the detected filter current is desired to be small as far as possible within such a range that it may be stably detected.

A mode control signal 601 is the logical product of the frequency acquisition signal 401 and the filter current detection signal 501. When the frequency is acquired and the filter current has been reduced to a sufficiently small value, the mode control signal 601 turns to "1". When this mode control signal 601 has turned to "1", the conversion gain of the phase signal output of a phase comparator 80 is reduced and a switch SW1 of a loop filter 83 is closed to change over from the fast acquisition state to high jitter suppression state.

As described above, the operation mode is switched at the minimum value point of the filter current. Even if the conversion gain of the phase comparator 80 and the resistance value of the loop filter are changed over, therefore, the input signal of a VCO 300 is not changed and is not affected by a significant external disturbance. The acquisition state can thus be continued.

In the above described embodiment, the operation mode of the PLL is switched from the fast acquisition state to the high jitter suppression state when the frequency has already been pulled in and the current value of the filter has been sufficiently reduced. Therefore, the acquisition time can be defined by only the characteristics of the fast acquisition state. It is possible to further improve the jitter suppression characteristics while assuring the fast acquisition characteristics.

In the embodiment of FIG. 16, both the conversion gain of the phase comparator 80 and the resistance value of the loop filter 83 are controlled by the mode control signal 601. Even if either one of these is controlled, however, the effect of the present invention is obtained.

Figures 22, 23:
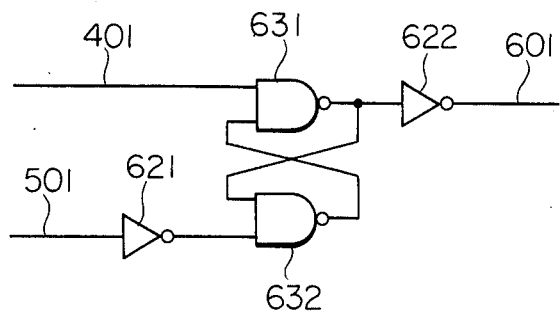
FIGS. 22 and 23 show another example of the mode control circuit and its operation, respectively.

In the embodiment of FIG. 16, the mode control circuit 600 is constituted by only one AND gate. FIG. 22 shows another embodiment of this circuit. In this embodiment, an RS flip-flop is composed of NAND gates 631 and 632. The frequency acquisition signal 401 is supplied to the NAND gate 631. And the filter current detection signal 501 is inverted by an inverter 621 to be supplied to the NAND gate 632. And the output of the flip-flop is inverted by an inverter 622 to be sent out as the mode control signal 601. FIG. 23 is a truth table for showing the operation of the mode control circuit 600. As evident from the truth table, the fast acquisition state is assumed irrespective of the filter current detection signal 501 when the frequency acquisition signal 401 is "0". When both the frequency acquisition signal 401 and the filter current detection signal 501 are "1", the high jitter suppression state is attained.

Further, the previous state is maintained when the frequency acquisition signal 401 is "1" and the filter current detection signal 501 is "0". Once the high jitter suppression state has been attained, the high jitter suppression state can be maintained irrespective of the filter current detection signal 501. Therefore, it is possible to provide a phase-locked loop which is stable even for a change in the filter current caused by jitter of the input signal $f_i$ or the like.

A specific example of the filter current detector circuit of FIG. 16 will now be described by referring to the drawing. Since this filter current detector circuit detects the phase difference between the input signal $f_i$ and the output signal $f_o$, it can also be regarded as a phase difference detector circuit.

Figure 24:
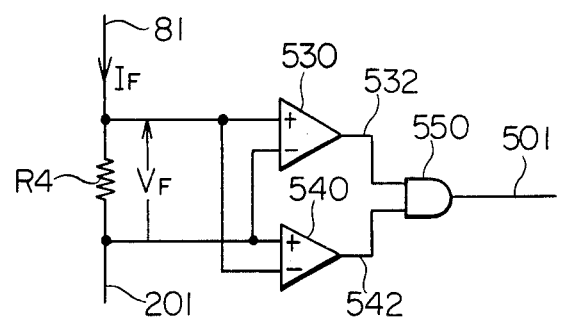
FIGS. 24 and 25 show an example of a filter current detector circuit and its operation, respectively.
Figure 25:
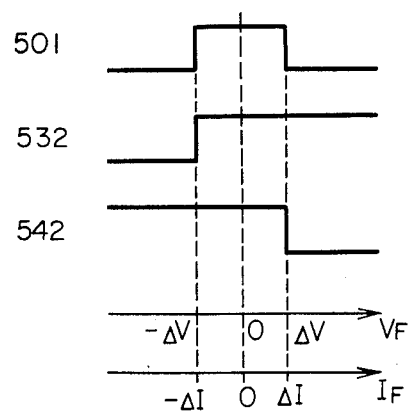

FIG. 24 shows a specific circuit of the filter current detector circuit 500. FIG. 25 is a waveform diagram for illustrating the operation of the circuit of FIG. 24.

When the filter current changes from a negative value to zero as shown in FIG. 21, it is necessary to set the threshold value for filter current detection to $-\Delta I$. Because the zero detection of the filter current cannot be conducted if in this case the threshold value is set to $+\Delta I$. On the other hand, it is necessary to set the threshold value to $+\Delta I$ when the filter current changes from the positive direction to zero on the contrary to FIG. 21. In this way, the object of the filter current detector circuit is to detect the current of $\pm\Delta I$.

FIG. 24 shows the configuration of the filter current detector circuit. The offset voltage of comparators 530 and 540 is shifted in one direction to be $-\Delta V$. This is easily attained by making the current density of a differential circuit constituting the comparator unbalanced in the design. The output 532 of the comparator 530 and the output 542 of the comparator 540 are connected to the input of an AND gate 550. With reference to FIG. 25, the voltage $V_F$ across a resistor R4 varies in proportion to the filter current $I_F$. The output 532 of the comparator 530 is inverted to turn to "1" when $V_F$ is $-\Delta V$. Since the inputs of the comparator 540 are opposite to those of the comparator 530, the output 542 of the comparator 540 is inverted to turn to "0" when $V_F$ has reached $+\Delta V$. The filter current detection signal 501 is the logical product of the outputs 532 and 542 of comparators and turns to "1" when $V_F$ is in the range from $-\Delta V$ to $+\Delta V$. Since the filter current $I_F$ is represented as $I_F = V_F/R_4$, the current detection range $\Delta I$ can be represented as $\Delta I = \Delta V/R4$. The current detection range $\Delta I$ can be defined by the offset voltage of the comparators 530 and 540 as well as the current detection resistor R4.

In the above description, the current is detected by using the voltage across the resistor R4. Since the object is to detect the current flowing through the filter 83, the current flowing through the resistor such as R2 may be detected.

Another circuit example of the frequency acquisition detector circuit 400 will now be described by referring to the drawing.

Figure 26:
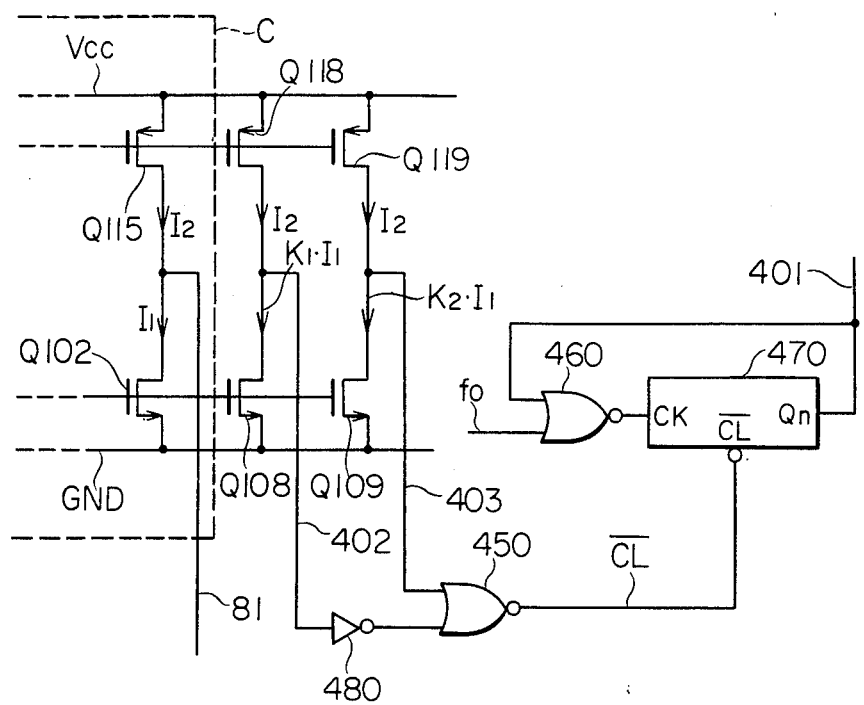
FIGS. 26 and 27 show another example of a frequency acquisition detector circuit and its operation, respectively.

FIG. 26 is a circuit diagram. The block of FIG. 26 surrounded by broken line C is the block C of FIG. 17. In FIG. 26, currents of NMOS transistors Q108 and Q109 are linked to the bias current $I_1$ of the phase comparator circuit 80 shown in FIG. 17 and are $K_1I_1$ and $K_2I_2$, respectively. Currents of PMOS transistors Q118 and Q119 are linked to the variable current $I_2$ of the phase comparator circuit 80 and both are $I_2$.

Figure 27:
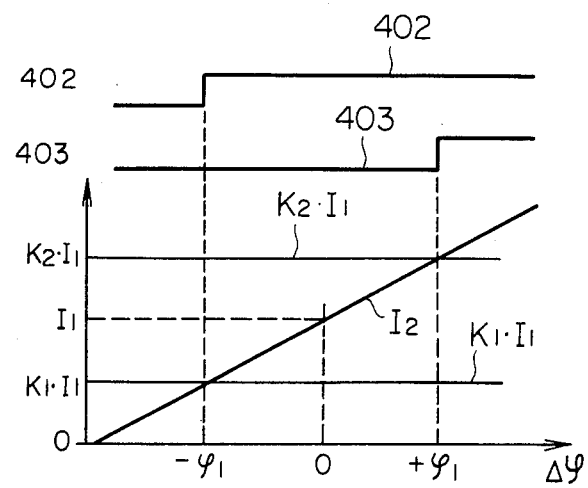

The operation waveform is shown in FIG. 27. As shown in FIG. 27, the variable current $I_2$ becomes equal to the bias current $I_1$ when the phase $\Delta\phi$ is zero and changes in accordance with a change in $\Delta\phi$. The drain output 402 of transistors Q108 and Q118 changes at a point where $I_2$ is equal to $K_1I_1$ and turns to "1". The drain output 403 of transistors Q109 and Q119 changes at a point where $I_2$ is equal to $K_2I_1$ and turns to "1". When $\Delta\phi$ is not in the range from $-\Delta_1$ to $+\Delta_1$, therefore, the clear signal $\overline{CL}$ of the counter 470 turns to "0" to clear the counter.

The configuration of components 450 to 470 shown in FIG. 26 is the same as those of FIG. 19.

Since the acquisition time in the embodiment of FIG. 16 can be defined by the characteristics of only the fast acquisition state, it is possible to assure the fast acquisition characteristics and the sufficient jitter suppression characteristics after the acquisition.

We claim:

1. A phase-locked loop comprising:
   phase comparator means for comparing the phase of a pulse signal based upon an input signal with the phase of a pulse signal based upon an output signal and for detecting the phase difference;
   smoothing filter means for smoothing an output of said phase comparator means;
   a loop filter coupled to an output of said smoothing filter means, said smoothing filter being separated from said loop filter; and
   voltage controlled oscillator means for generating a signal having a frequency corresponding to the voltage generated in said loop filter as said output signal, the phase of the pulse signal based upon said output signal of said voltage controlled oscillator means being compared with the phase of the pulse signal based upon said input signal in said phase comparator means to maintain synchronization between said input signal and said output signal,
   wherein said phase comparator means generates a first pulse and a second pulse with pulse width varying in accordance with said phase, and wherein said smoothing filter means comprises:
   an integrator circuit for conducting a charging operation in response to one of said first and second pulses and for conducting a discharging operation in response to the other of said first and second pulses;
   sample and hold means for sampling and holding the output of said integrator circuit; and
   direct current output means for sending out a direct current in accordance with the output of said sample and hold means and for controlling at least one of the charging current and the discharging current of said integrator circuit in a negative feedback manner on the basis of the output of said sample and hold means.

2. A phase-locked loop according to claim 1, wherein said integrator circuit constituting said smoothing filter means includes a first current mirror circuit and a second current mirror circuit, wherein charging operation is conducted with a current caused by one of said first and second current mirror circuits in response to one of said first and second pulses, and discharging operation is conducted with a current caused by the other of said first and second current mirror circuits in response to the other of said first and second pulses, and wherein the current of at least one of said first and second current mirror circuits is controlled by said direct current output means.

3. A phase-locked loop comprising:
   phase comparator means for detecting the phase difference between the phase of an input pulse derived from an input signal of said phase-locked loop and the phase of an output pulse derived from an output signal of said phase-locked loop and for successively sending out first and second control pulses having a pulse width difference corresponding to said phase difference;
   time difference detector means for generating a current representative of said phase difference, said time difference detector means including a signal source controlled by said first and second control pulses, integrator means for integrating an output of said signal source, hold means for holding an output of said integrator means upon completion of integration by said integrator means, and current generator means coupled to said hold means for generating a current according to an output of said hold means as said current representative of said phase difference;
   a loop filter coupled to an output of said time difference detector means; and
   voltage controlled oscillator means connected to said loop filter to generate as an output signal of said phase-locked loop a signal having a frequency depending upon a voltage generated in said loop filter by said current representative of said phase difference.

4. A phase-locked loop according to claim 3, wherein said signal source comprises:
- first current source means connected to the input of said integrator means to generate one of the charging current and the discharging current to be integrated by said integrator means;
- second current source means connected to said integrator means to generate the other of the charging current and the discharging current to be integrated by said integrator means;
- current control means for responding to said hold means and for controlling the current of said first or second current source means by means of the output of said hold means; and
- first and second switch means respectively connected in series with said first and second current source means to control the flow of said charging current and discharging current in response to said first and second control pulses.

5. A phase-locked loop according to claim 4, wherein said current control means includes third current source means connected to said hold means to generate a current corresponding to the voltage held in said hold means;
- wherein said second current source means includes first and second transistors connected to form a current mirror circuit, said first transistor is connected to said third current source means, and said second transistor is connected in series with said second switch means; and
- wherein said first current source means includes third and fourth transistors connected to a constant current source to form a current mirror circuit, said constant current source and said third transistor are connected in series, and said fourth transistor is connected in series with said first switch means.

6. A phase-locked loop according to claim 5, wherein said current generator means includes a fifth transistor connected to said first transistor to form a current mirror circuit and a sixth transistor connected to said third transistor to form a current mirror circuit, said fifth and sixth transistors are connected in series, and the current representative of said phase difference is sent out from the coupling point between said fifth and sixth transistors.

7. A phase-locked loop according to claim 5, wherein each of said first and second switches comprises a MOS transistor.

8. A phase-locked loop according to claim 4, wherein said integrator means includes an operational amplifier having a noninverting input fixed to a predetermined potential, an inverting input connected so as to receive the current from said first and second current source means, and an output terminal, and wherein said integrator means further includes a capacitor connected between said inverting input and said output.

9. A phase-locked loop according to claim 4, wherein said integrator means includes an inverter having an input connected so as to receive the current from said first and second current source means and having an output, and wherein said integrator means further includes a capacitor connected between said input and said output of said inverter.

10. A phase-locked loop according to claim 3, wherein said phase comparator means includes means for generating a third control pulse after said second control pulse; and
- wherein said hold means includes a capacitor and a third switch connected between the output of said integrator means and said capacitor, and said third switch turns on in response to said third control pulse.

11. A phase-locked loop according to claim 10, wherein said phase comparator means includes:
- first detector means for detecting the first level change point of said input pulse;
- second detector means for detecting the first level change point of said output pulse following said first level change point of said input pulse;
- third detector means for detecting the second level change point following the first level change point of said output pulse;
- fourth detector means for detecting the third level change point following said second level change point of said output pulse;
- fifth detector means connected to outputs of said first and second detector means to detect the first time difference between the first level change point of said input pulse and said first level change point of said output pulse;
- sixth detector means connected to the outputs of said third and fourth detector means to detect the second time difference between said second level change point and said third level change point of said output pulse; and
- seventh detector means connected to said second and third detector means to detect the time difference between said first level change point and said second level change point of said output pulse,
- wherein the output of said fifth detector means is used as one of said first and second control pulses, and the output of said sixth detector means is used as the other of said first and second control pulses, and wherein the output of said seventh detector means is used as said third control pulse.

12. A phase-locked loop comprising:
- a voltage controlled oscillator;
- phase comparator means for comparing the phase of an output signal of said voltage controlled oscillator with the phase of an input signal of said phase-locked loop and for detecting the phase difference;
- a loop filter for passing through only low frequency components contained in an output of said phase comparator means and for sending out a control voltage to control said voltage controlled oscillator;
- acquisition detector means connected to said phase comparator means to send out a frequency acquisition signal when said phase comparator means has sent out a value less than a first value corresponding to a first predetermined phase difference for a period longer than a predetermined time;
- phase difference detector means coupled to said phase comparator means, for sending out a phase synchronization signal when an output of said phase comparator means becomes less than a second value corresponding to a second predetermined phase difference less than said first predetermined phase difference; and
- mode control means coupled to said acquisition detector means, said phase difference detector means, said loop filter and said phase comparator means, for sending out a control signal to said loop filter and said phase comparator means to control at least one of said loop filter and said phase comparataor means so as to increase the time constant of said loop filter and so as to lower the gain of said phase comparator means, respectively, when both said frequency acquisition signal and phase synchronization signal have been sent out.

13. A phase-locked loop according to claim 12, wherein said phase difference detector means includes means for detecting the current flowing into said loop filter to detect the output magnitude of said phase comparator means.

14. A phase-locked loop according to claim 12, wherein said mode control means includes an AND gate for deriving the logical product of said frequency acquisition signal and said phase synchronization signal.

15. A phase-locked loop according to claim 12, wherein said mode control means includes such a logic circuit that said control signal is not sent out at all times when said frequency acquisition signal is not sent out and the presence or absence of said control signal under the immediately preceding state is held as it is when said frequency acquisition signal is sent out and said phase synchronization signal is not sent out.

16. A phase-locked loop according to claim 12, wherein said phase comparator means includes:
control means for detecting the phase difference between the phase of an input pulse derived from the input signal of said phase-locked loop and the phase of an output pulse derived from said output signal of said voltage controlled oscillator and for successively sending out first and second control pulses having pulse width difference corresponding to said phase difference; and phase difference/current converter means including a signal source controlled by said first and second control pulses, integrator means for integrating the output of said signal source, hold means for holding the output of said integrator means upon completion of integration by said integrator means, and current generator means for generating a current according to the output of said hold means as a current representative of said phase difference.

* * * * *